US012598797B2

(12) United States Patent
Lee et al.

(10) Patent No.: US 12,598,797 B2
(45) Date of Patent: Apr. 7, 2026

(54) GATE SPACERS IN SEMICONDUCTOR DEVICES

(71) Applicant: Taiwan Semiconductor Manufacturing Company Ltd., Hsinchu (TW)

(72) Inventors: Shen-Yang Lee, Miaoli (TW); Chun-Fu Lu, Hsinchu (TW); Hsiang-Pi Chang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 386 days.

(21) Appl. No.: 18/177,911

(22) Filed: Mar. 3, 2023

(65) Prior Publication Data

US 2024/0297239 A1    Sep. 5, 2024

(51) Int. Cl.
| | |
|---|---|
| *H10D 64/01* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 84/01* | (2025.01) |

(52) U.S. Cl.
CPC ......... *H10D 64/021* (2025.01); *H10D 30/014* (2025.01); *H10D 30/43* (2025.01); *H10D 30/6735* (2025.01); *H10D 30/6757* (2025.01); *H10D 62/121* (2025.01); *H10D 84/0128* (2025.01); *H10D 84/0147* (2025.01)

(58) Field of Classification Search
CPC ............. H10D 30/6735; H10D 64/021; H10D 30/6757; H10D 30/014; H10D 84/0147; H10D 30/43; H10D 62/121; H10D 84/0128
See application file for complete search history.

(56) References Cited

U.S. PATENT DOCUMENTS

| | | |
|---|---|---|
| 2012/0119303 A1 | 5/2012 | Jangjian et al. |
| 2022/0123152 A1 | 4/2022 | Abhijith et al. |
| 2023/0066230 A1 | 3/2023 | Peng et al. |
| 2023/0197806 A1* | 6/2023 | Cho .................... H10D 30/024 |
| | | 257/401 |

* cited by examiner

*Primary Examiner* — Changhyun Yi
(74) *Attorney, Agent, or Firm* — Sterne, Kessler, Goldstein & Fox P.L.L.C.

(57) ABSTRACT

A semiconductor device and a method of fabricating the semiconductor device are disclosed. The method includes forming a fin base on a substrate, forming a superlattice structure including first and second nanostructured layers on the fin base, forming a polysilicon structure on the superlattice structure, epitaxially growing a S/D region on the fin base and adjacent to the first nanostructured layer, forming an oxygen-rich outer gate spacer including a first dielectric material with a first non-stoichiometric composition on a sidewall of the polysilicon structure, forming an oxygen-rich inner gate spacer including a second dielectric material with a second non-stoichiometric composition on a sidewall of the second nanostructured layer, and replacing the polysilicon structure with a gate structure.

20 Claims, 26 Drawing Sheets

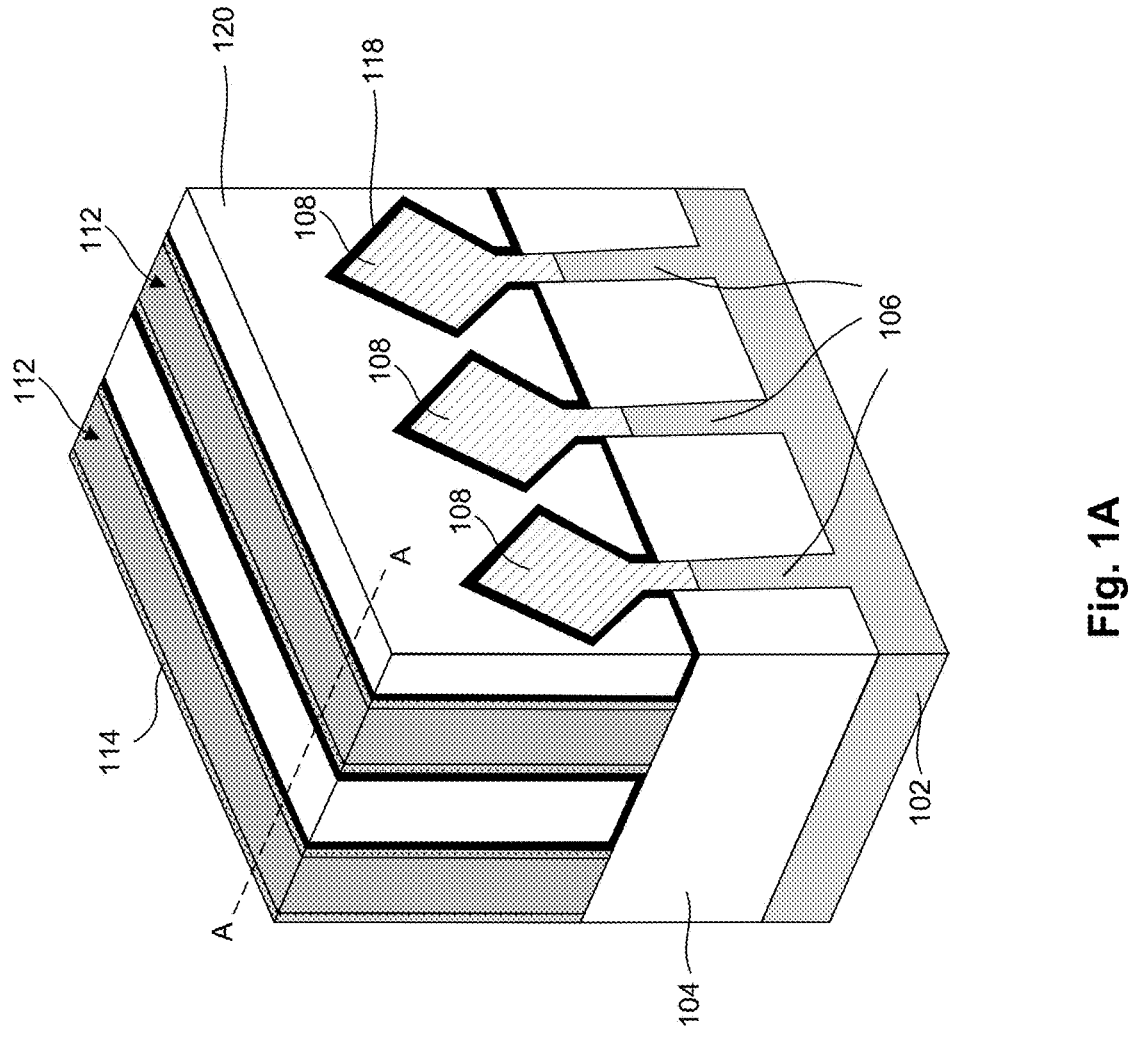
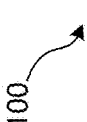
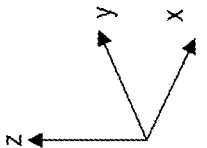
Fig. 1A

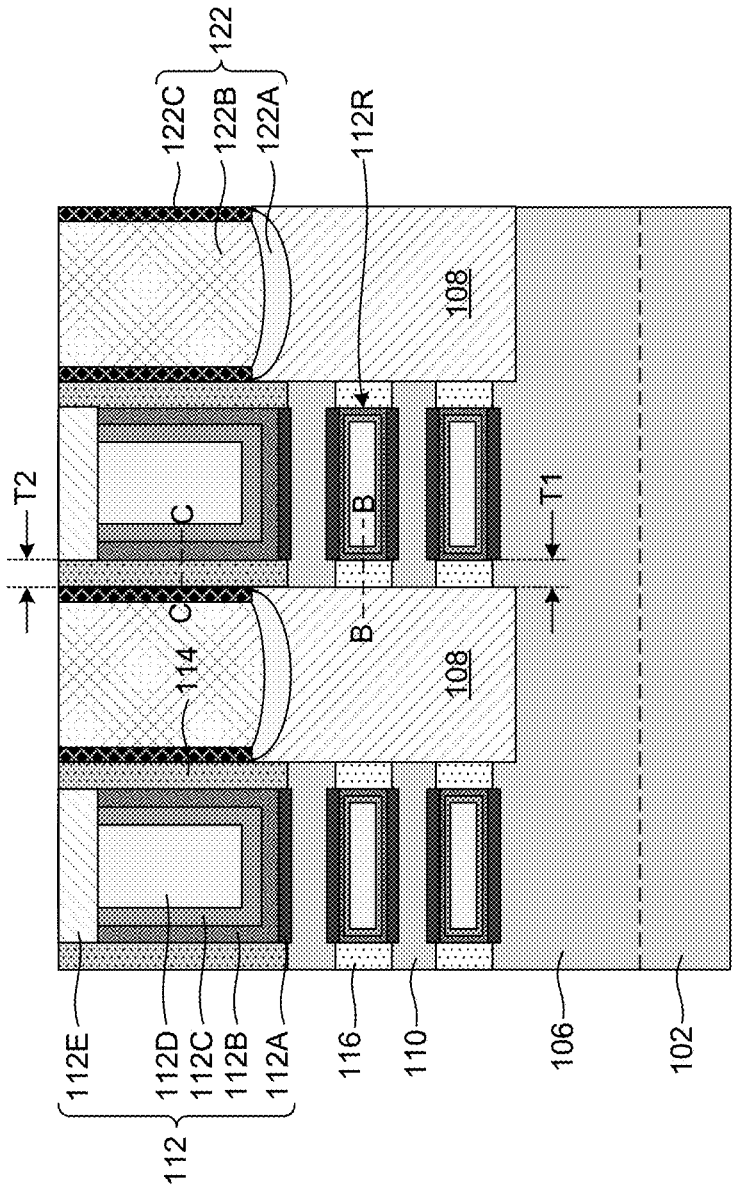
FIG. 1B
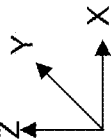

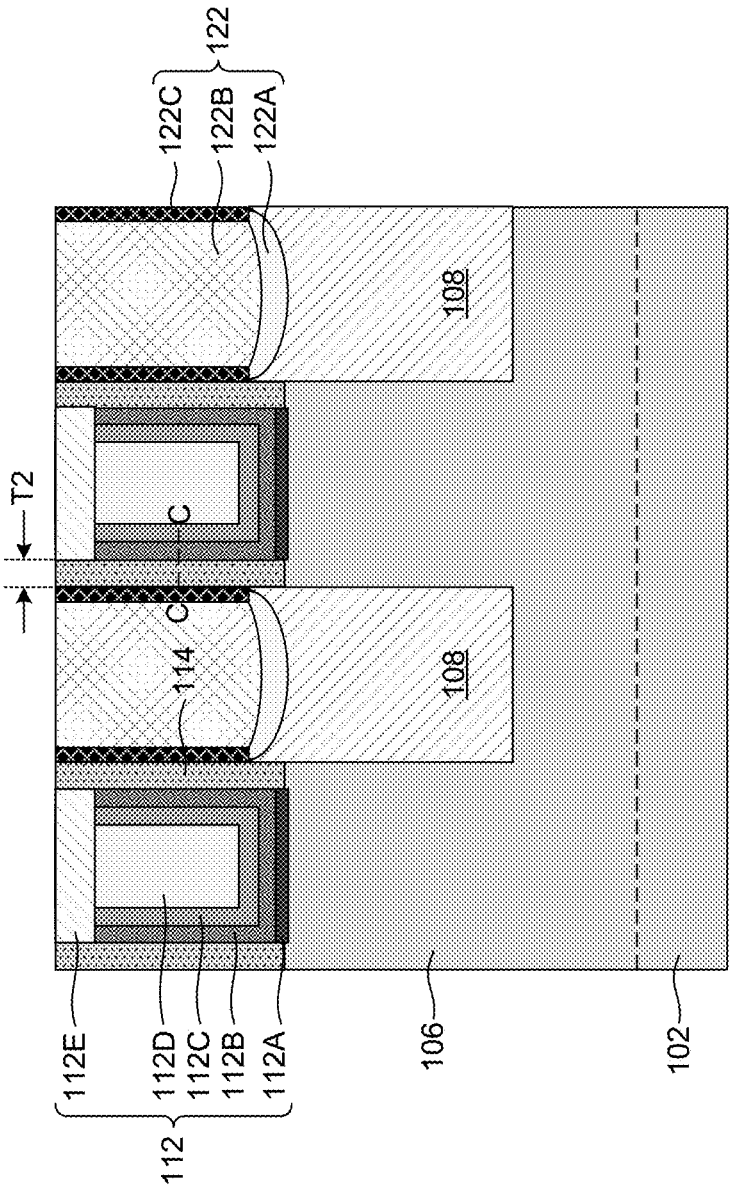
FIG. 1E
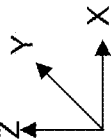

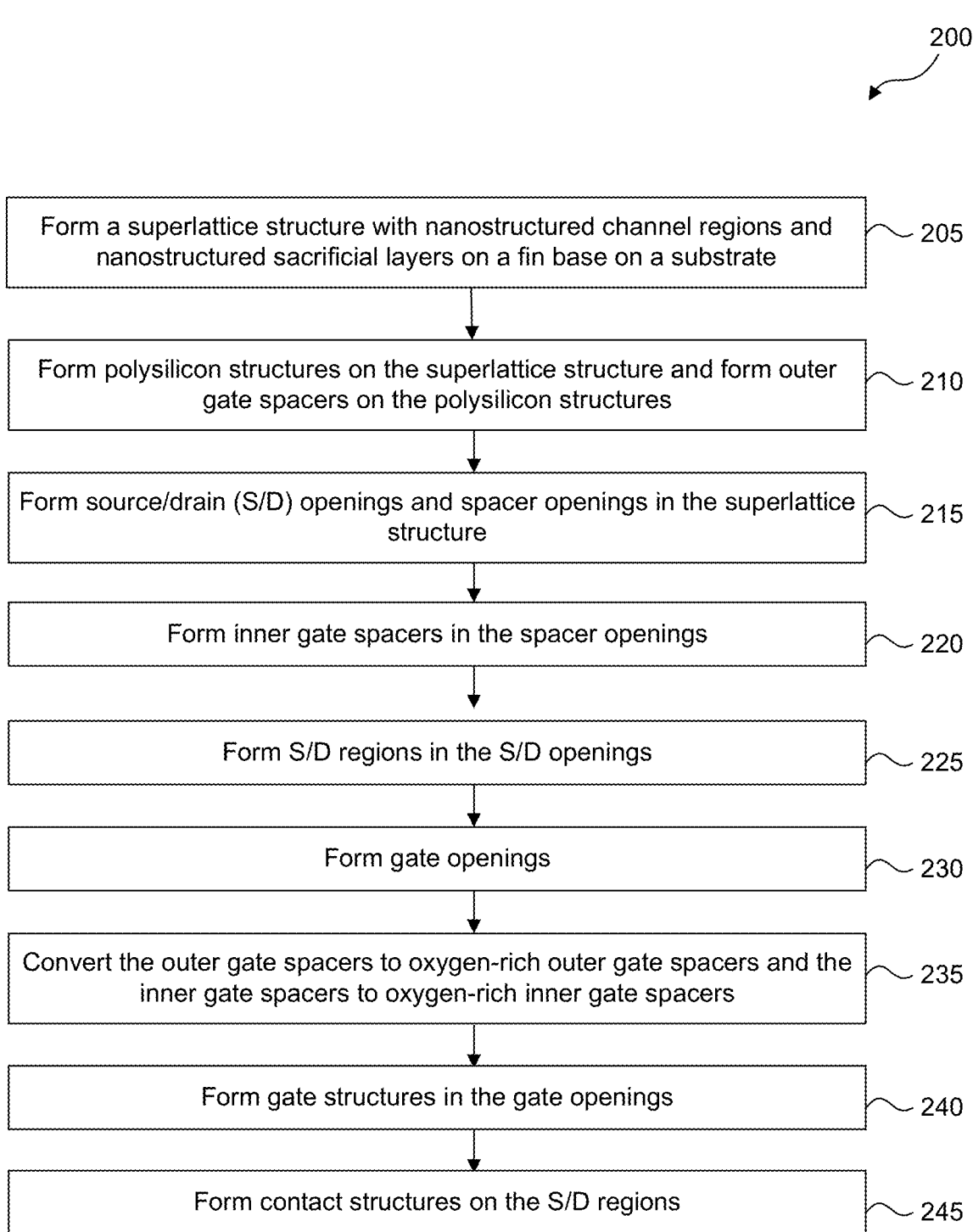

200

Form a superlattice structure with nanostructured channel regions and nanostructured sacrificial layers on a fin base on a substrate ⟶ 205

Form polysilicon structures on the superlattice structure and form outer gate spacers on the polysilicon structures ⟶ 210

Form source/drain (S/D) openings and spacer openings in the superlattice structure ⟶ 215

Form inner gate spacers in the spacer openings ⟶ 220

Form S/D regions in the S/D openings ⟶ 225

Form gate openings ⟶ 230

Convert the outer gate spacers to oxygen-rich outer gate spacers and the inner gate spacers to oxygen-rich inner gate spacers ⟶ 235

Form gate structures in the gate openings ⟶ 240

Form contact structures on the S/D regions ⟶ 245

Fig. 2

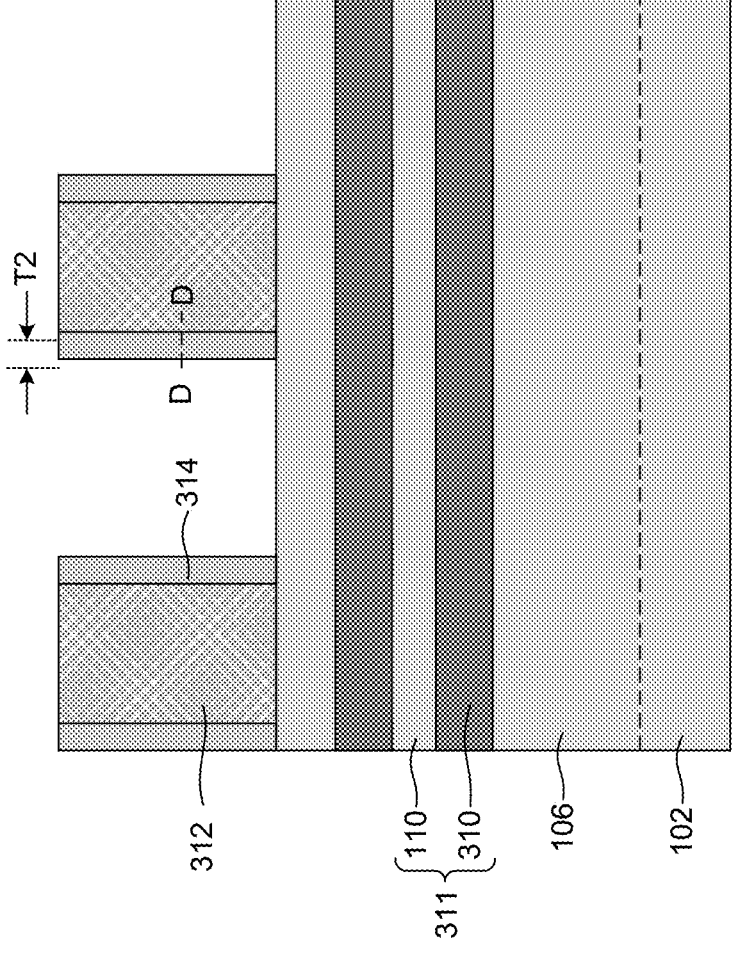
FIG. 3A

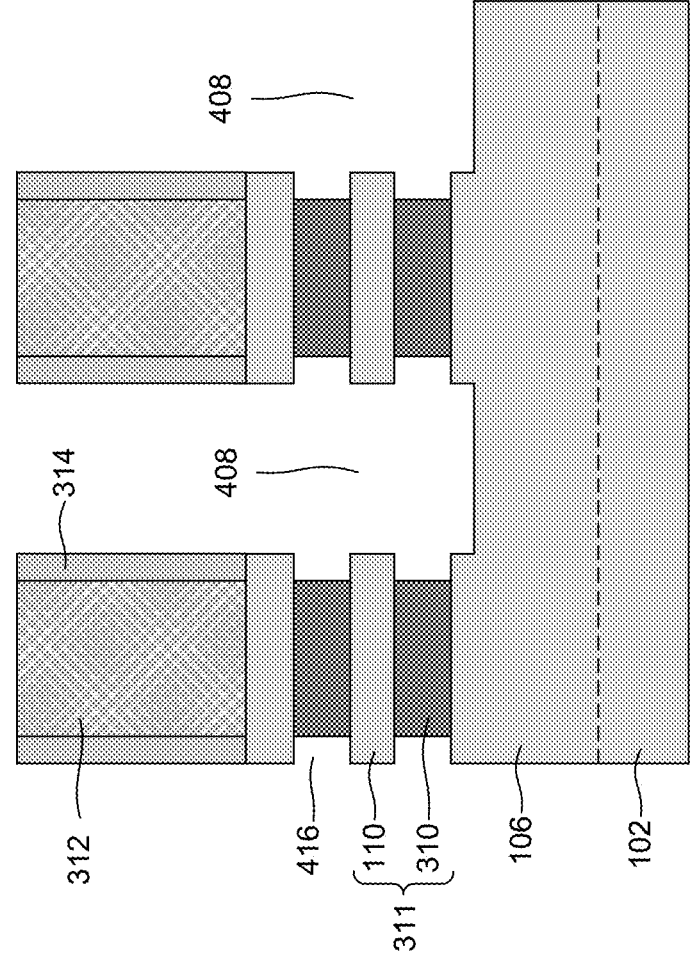
FIG. 4
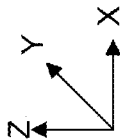

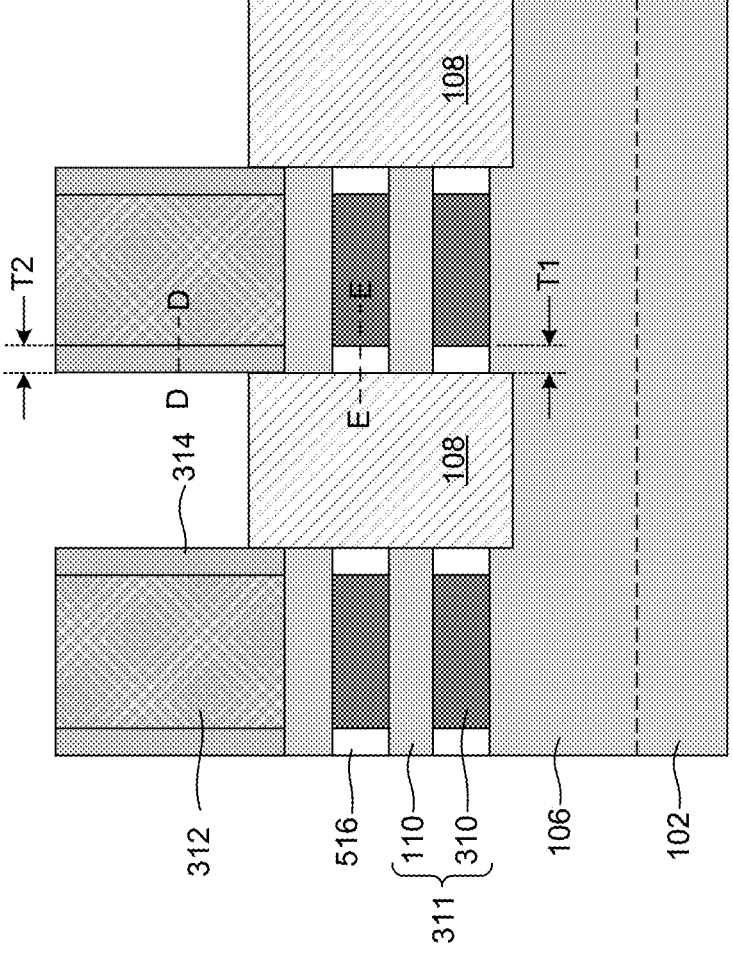
FIG. 5A
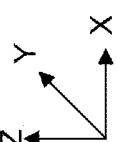

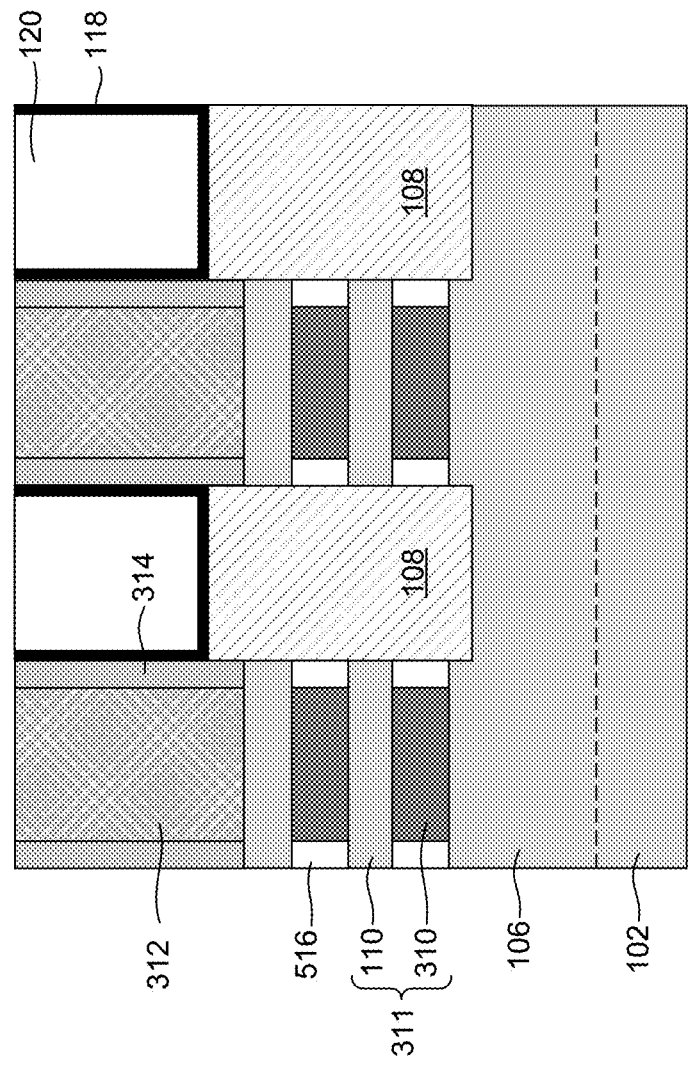
FIG. 6

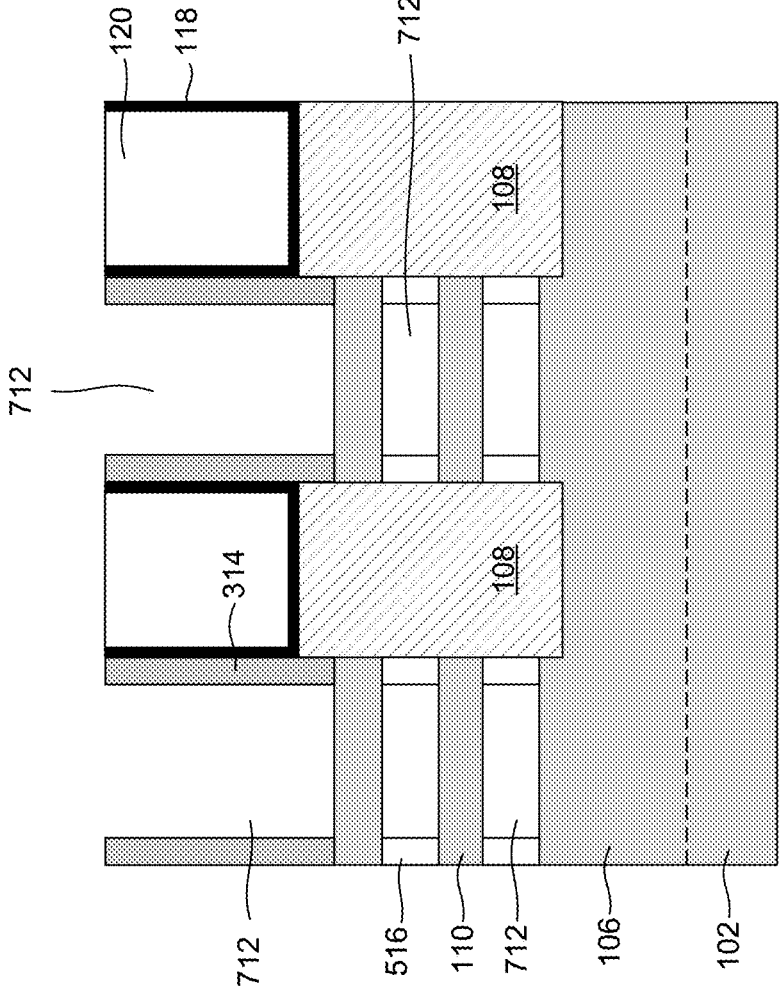
FIG. 7
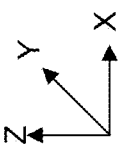

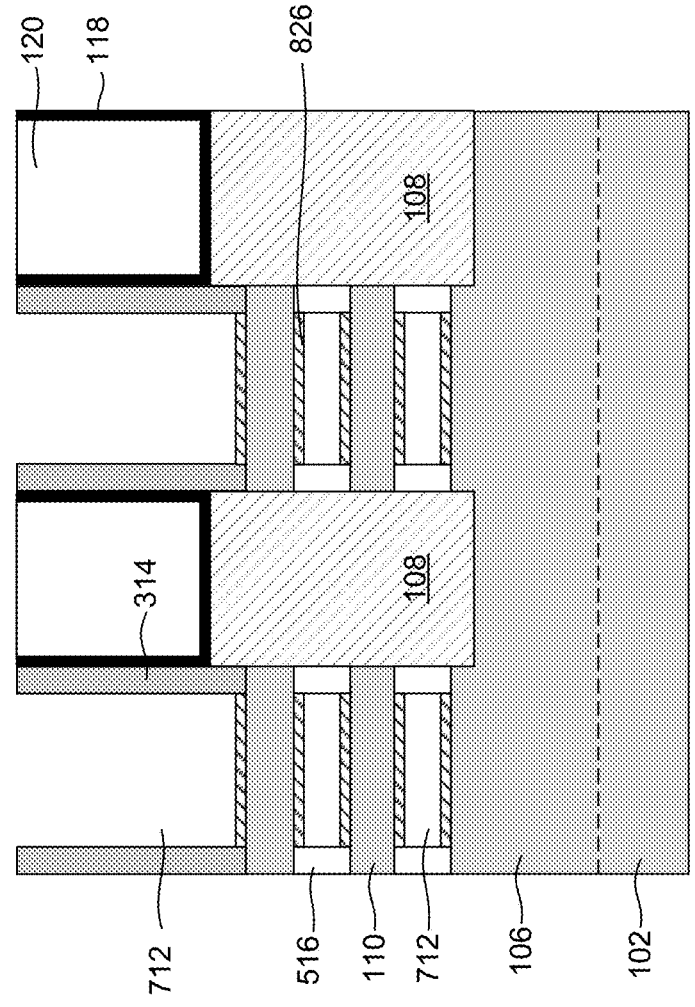
FIG. 8

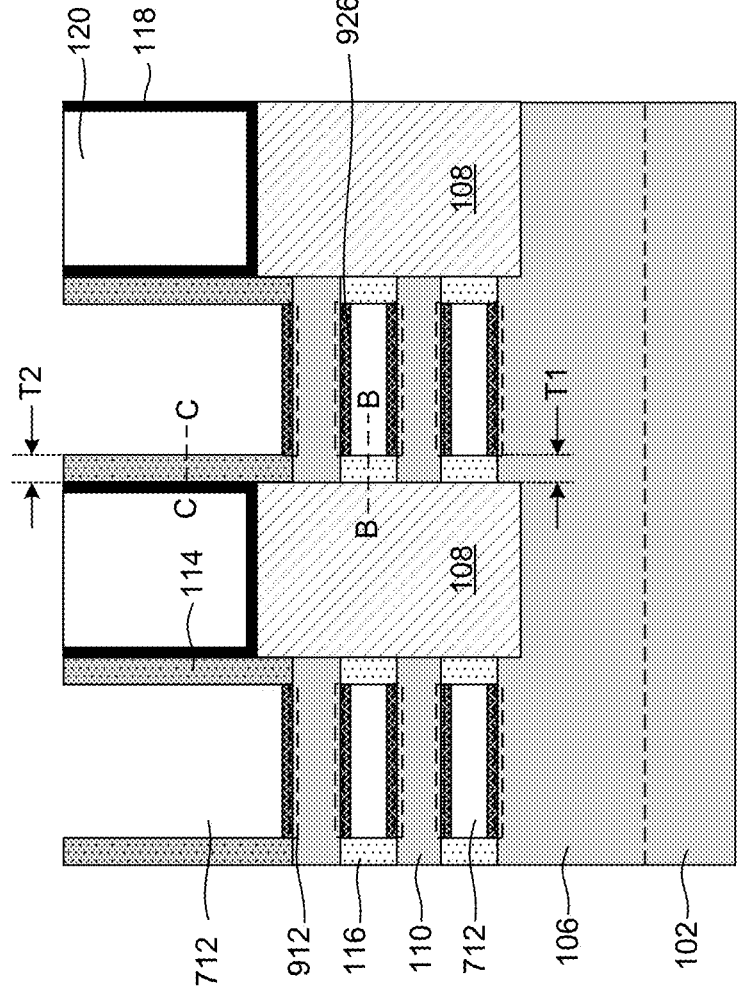
FIG. 9

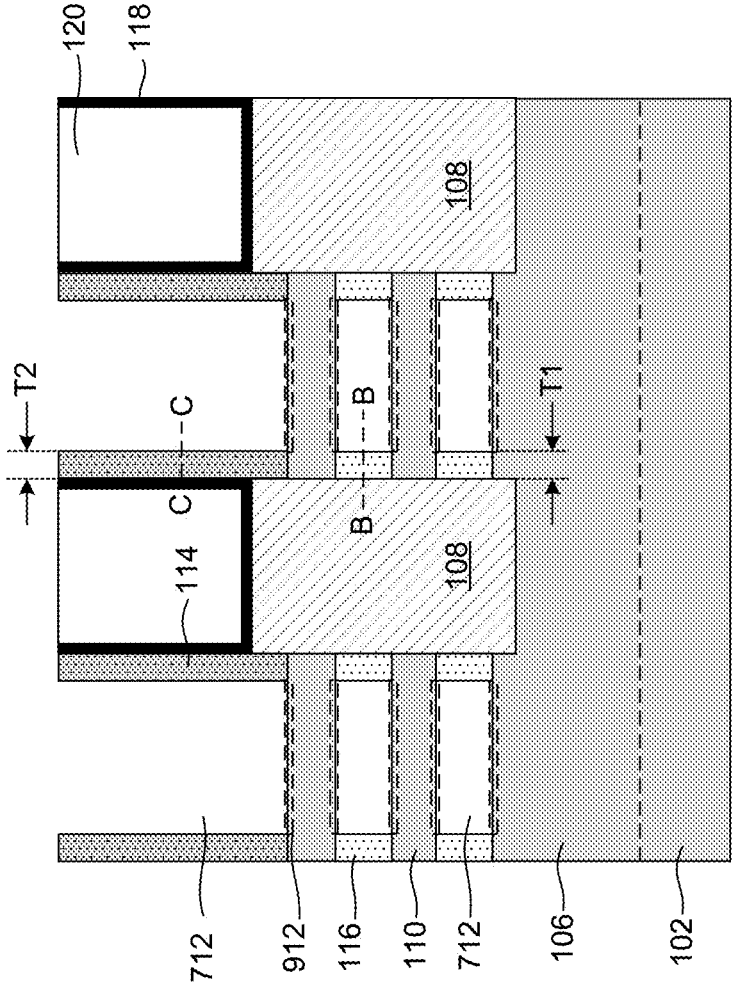
FIG. 10
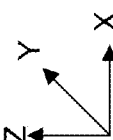

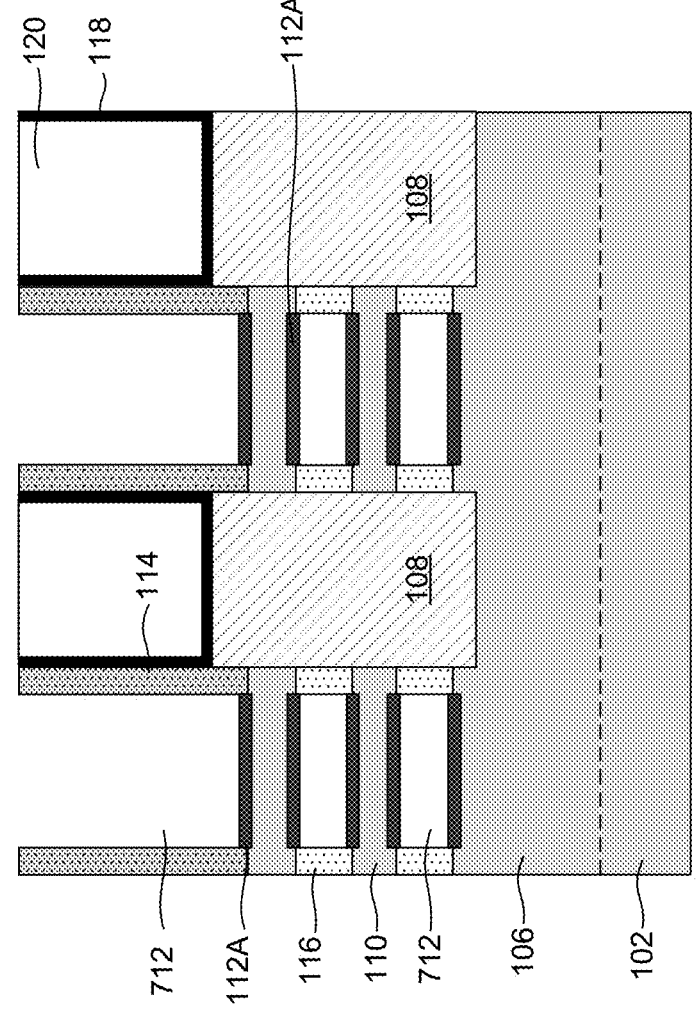
FIG. 11
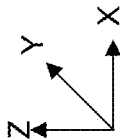

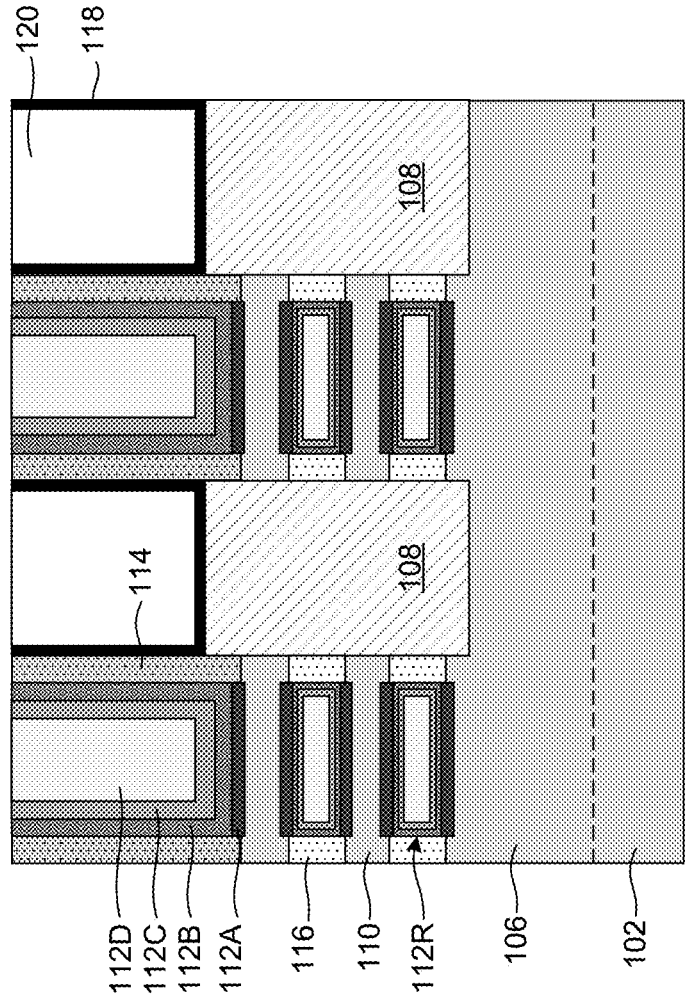
FIG. 12

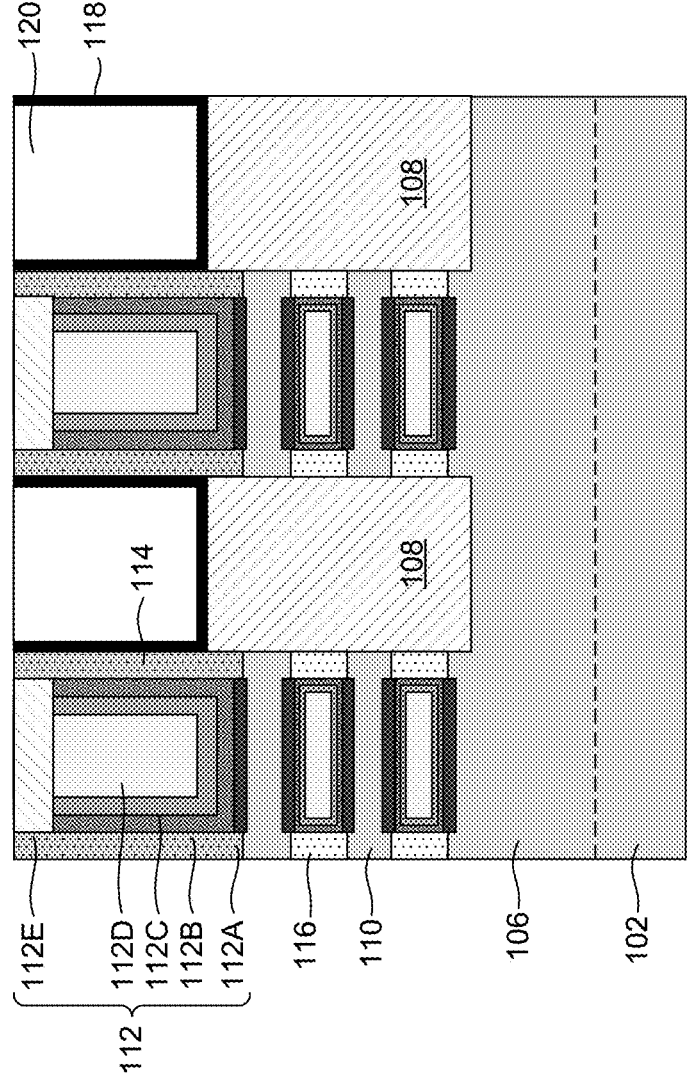
FIG. 13
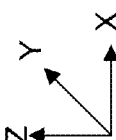

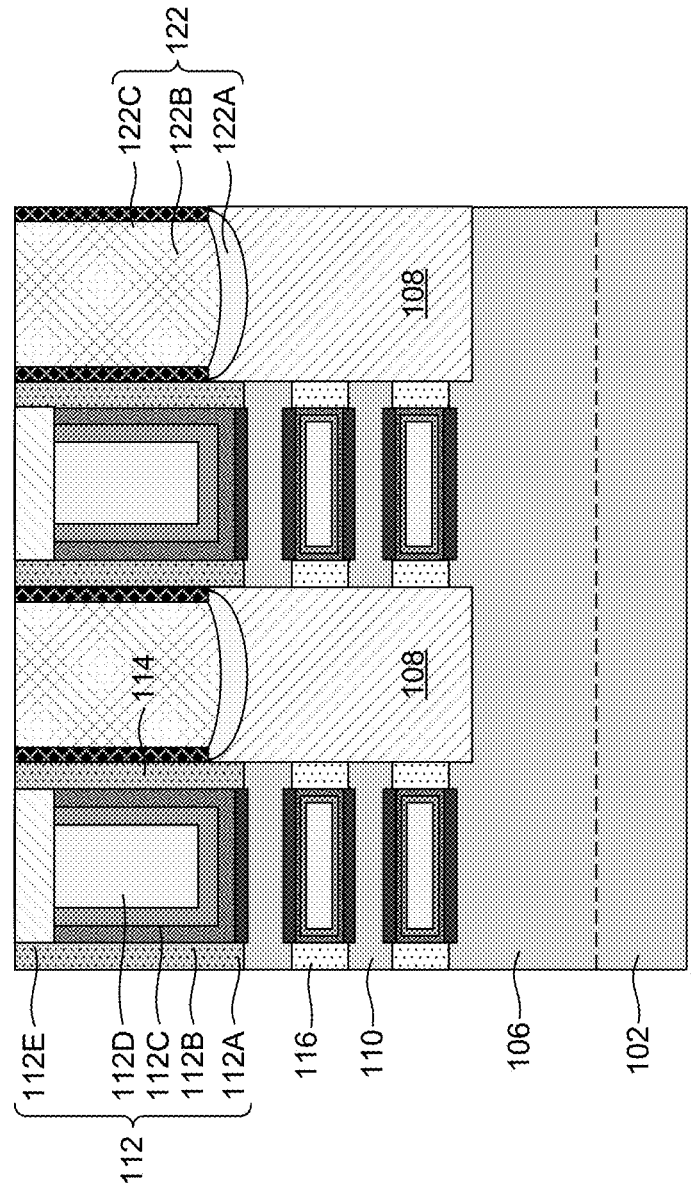
FIG. 14

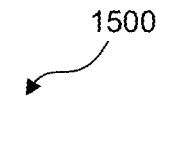
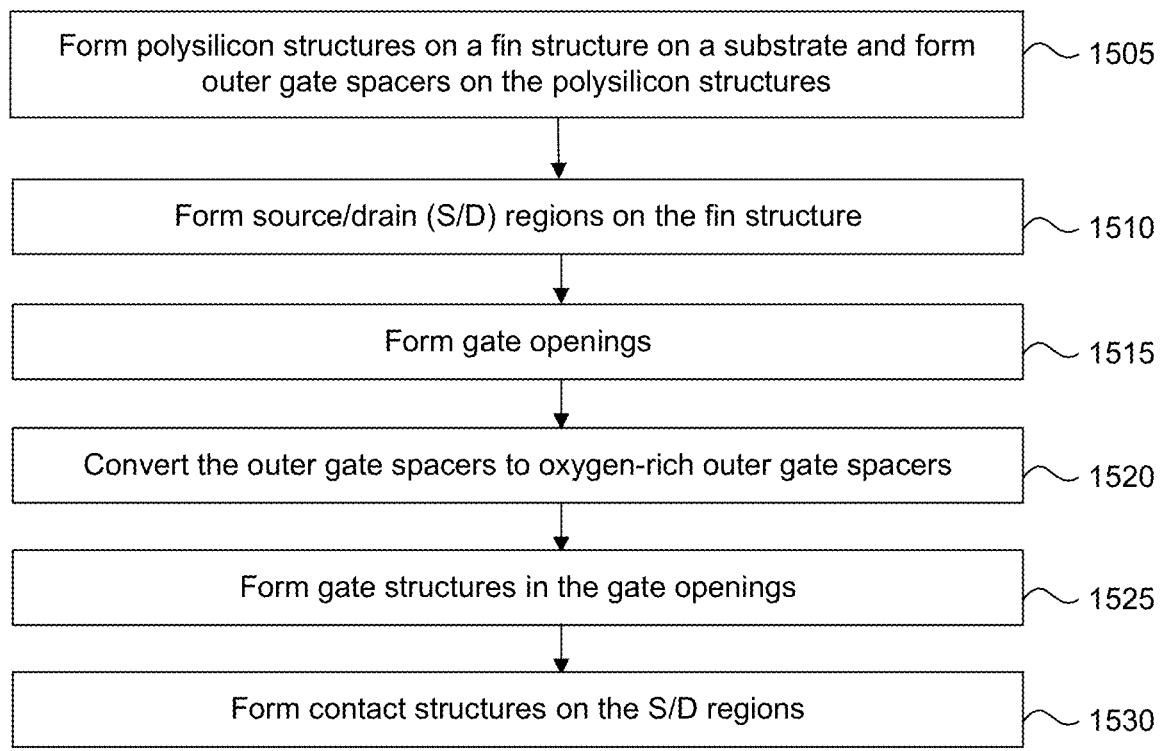
1500
| Form polysilicon structures on a fin structure on a substrate and form outer gate spacers on the polysilicon structures | ~ 1505 |
| Form source/drain (S/D) regions on the fin structure | ~ 1510 |
| Form gate openings | ~ 1515 |
| Convert the outer gate spacers to oxygen-rich outer gate spacers | ~ 1520 |
| Form gate structures in the gate openings | ~ 1525 |
| Form contact structures on the S/D regions | ~ 1530 |
Fig. 15

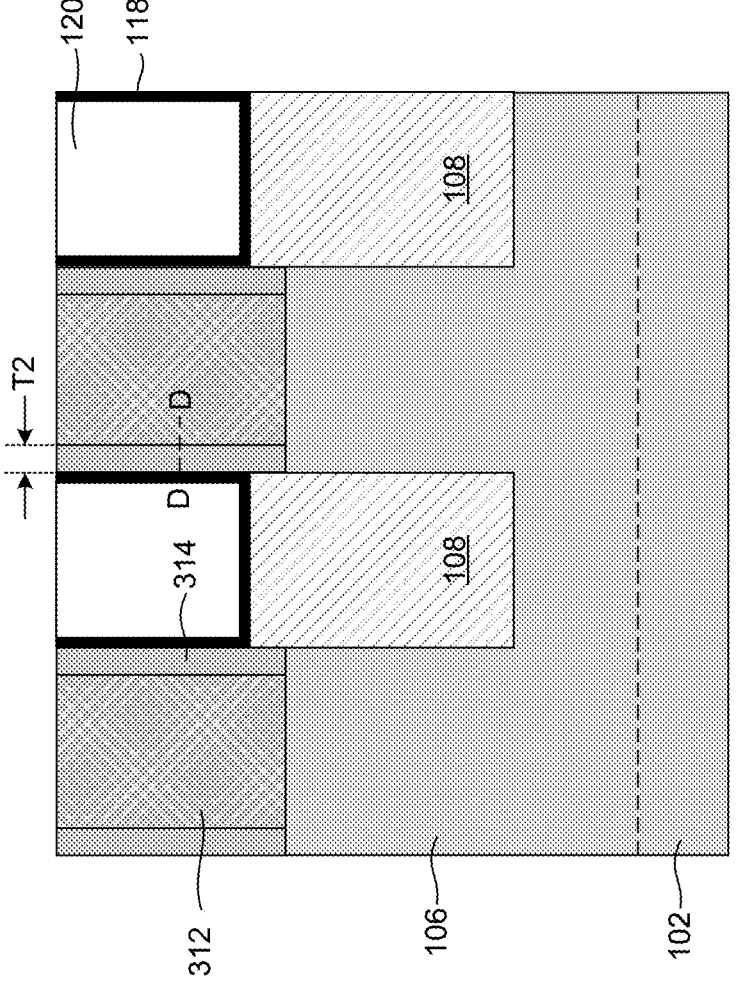
FIG. 16
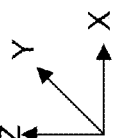

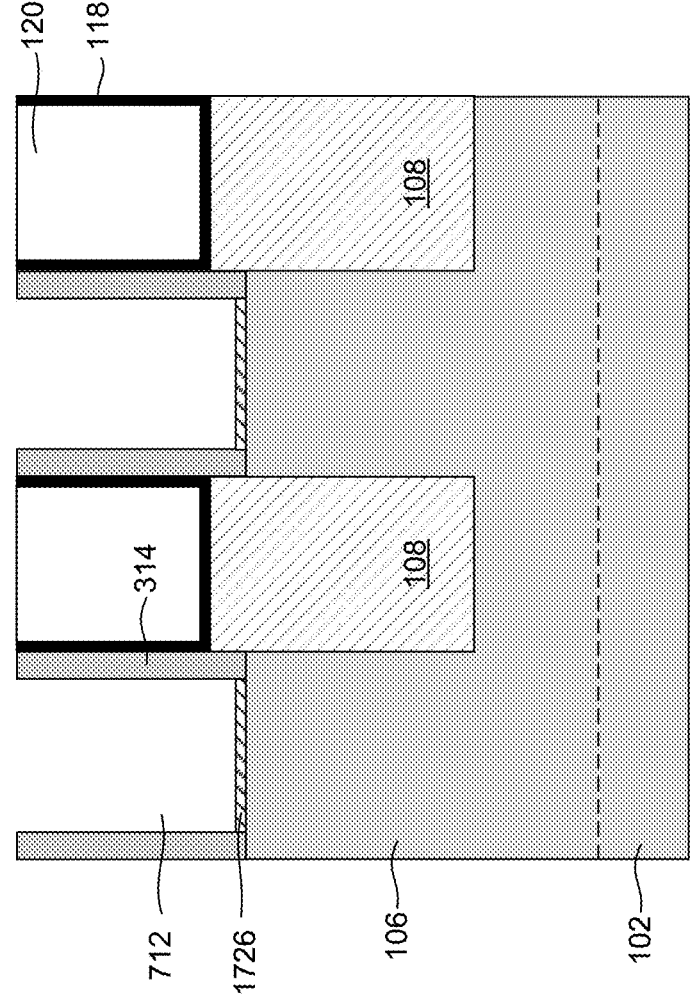
FIG. 17

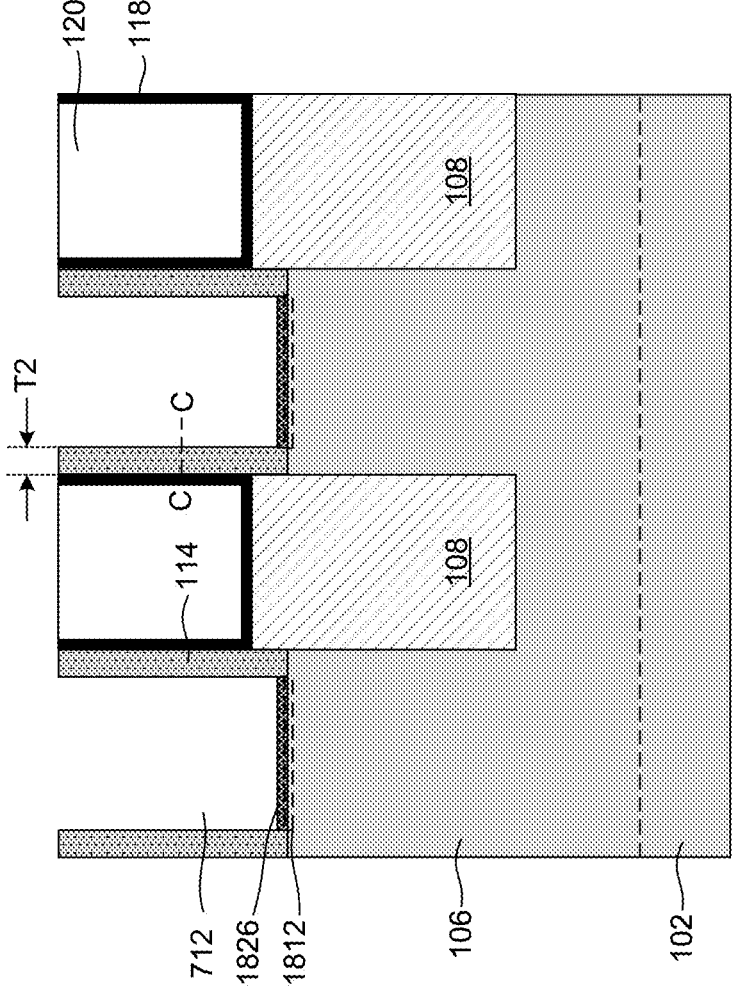
FIG. 18
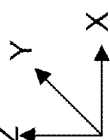

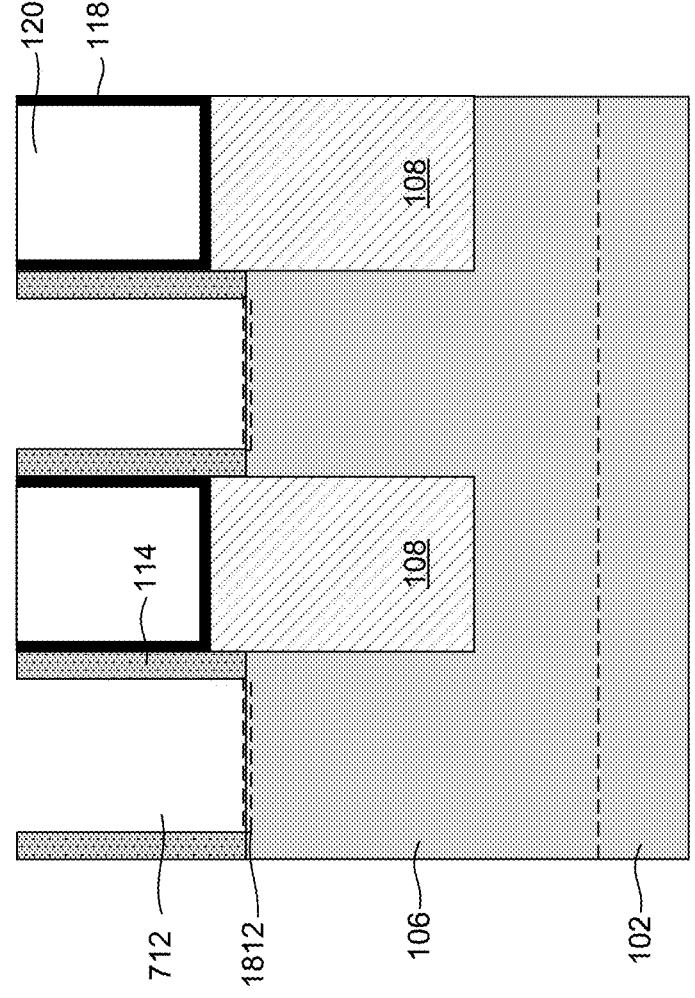
FIG. 19

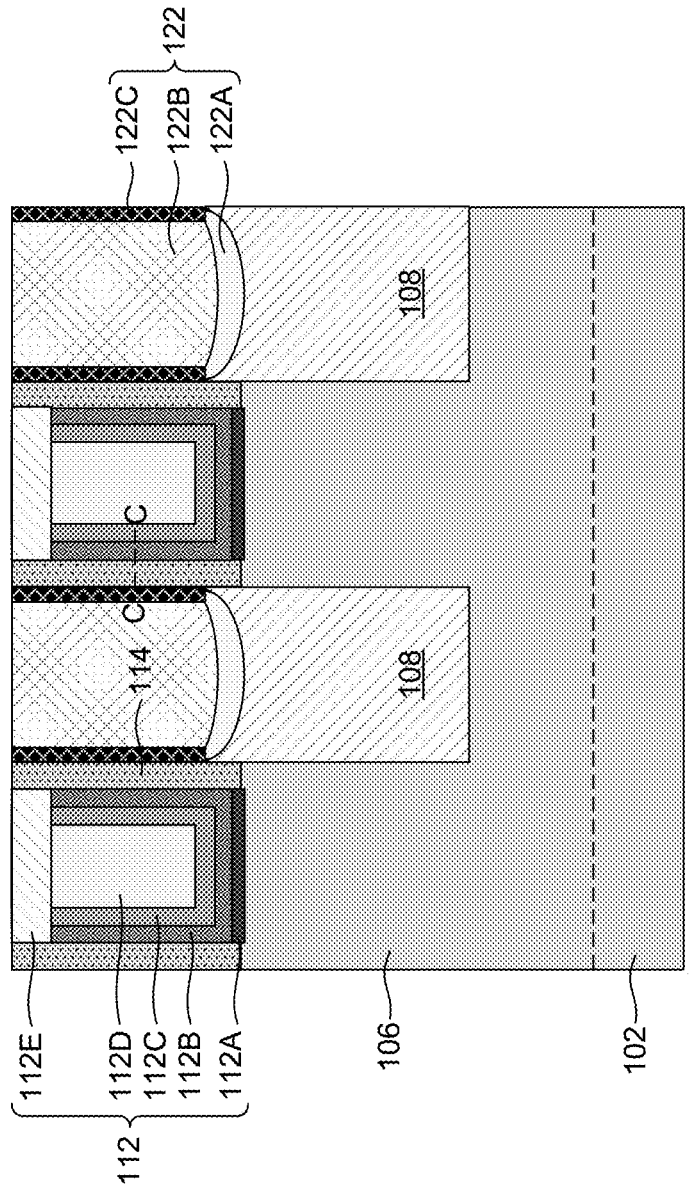
FIG. 20
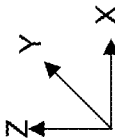

GATE SPACERS IN SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), fin field effect transistors (finFETs), and gate-all-around (GAA) FETs. Such scaling down has increased the challenges of manufacturing highly reliable semiconductor devices.

BRIEF DESCRIPTION OF THE DRAWINGS

Aspects of this disclosure are best understood from the following detailed description when read with the accompanying figures.

FIG. 1A illustrates an isometric view of a semiconductor device with gate spacers, in accordance with some embodiments.

FIGS. 1B and 1E illustrate different cross-sectional views of a semiconductor device with oxygen-rich gate spacers, in accordance with some embodiments.

FIG. 2 is a flow diagram of a method for fabricating a semiconductor device with oxygen-rich gate spacers, in accordance with some embodiments.

FIGS. 3A, 4, 5A, and 6-14 illustrate cross-sectional views of a semiconductor device with oxygen-rich gate spacers at various stages of its fabrication process, in accordance with some embodiments.

FIG. 15 is a flow diagram of a method for fabricating another semiconductor device with oxygen-rich gate spacers, in accordance with some embodiments.

FIGS. 16-20 illustrate cross-sectional views of another semiconductor device with oxygen-rich gate spacers at various stages of its fabrication process, in accordance with some embodiments.

Figure 1C:
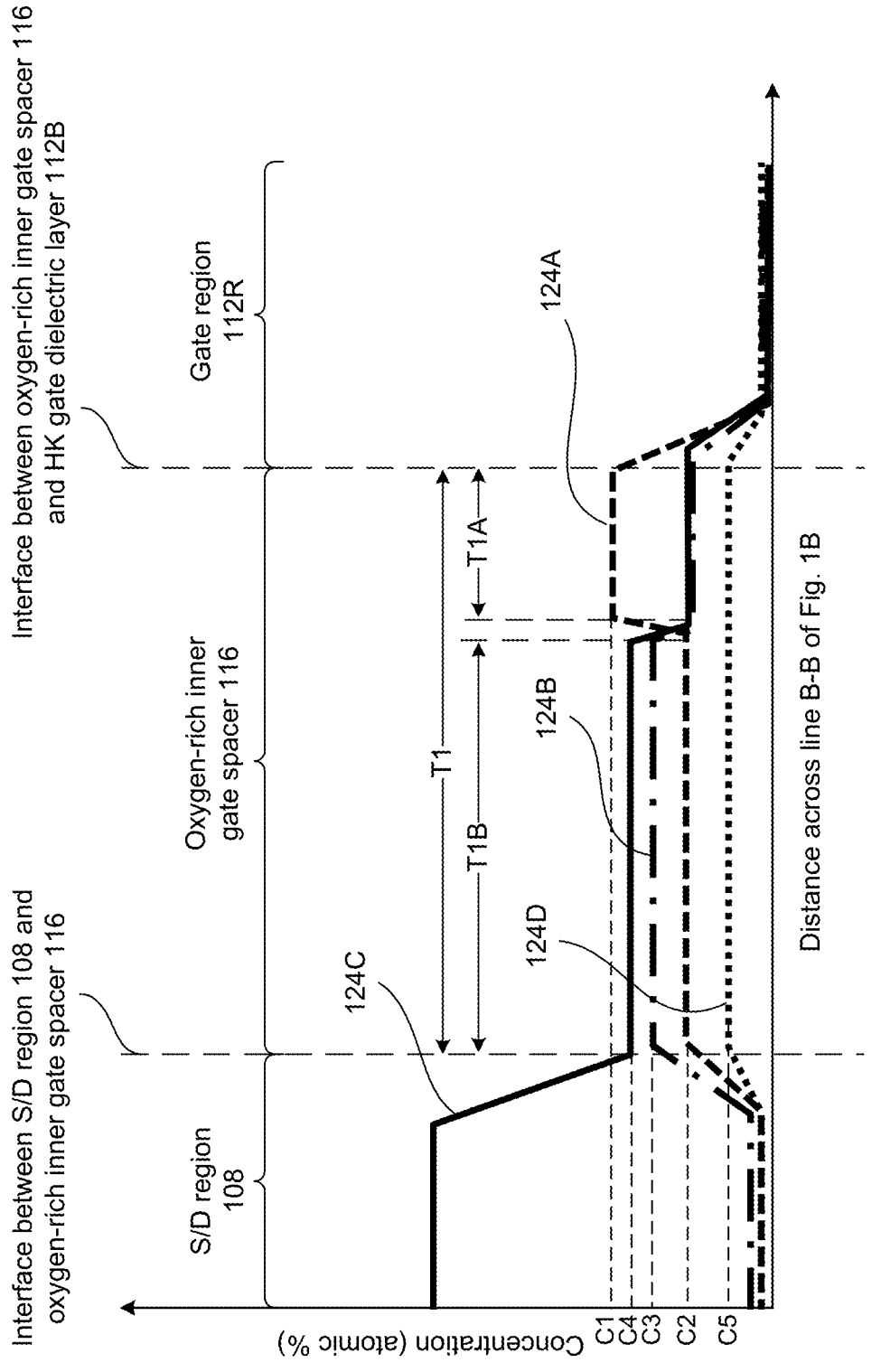
FIGS. 1C and 1D illustrate characteristics of oxygen-rich gate spacers in a semiconductor device, in accordance with some embodiments.

Illustrative embodiments will now be described with reference to the accompanying drawings. In the drawings, like reference numerals generally indicate identical, functionally similar, and/or structurally similar elements. The discussion of elements with the same annotations applies to each other, unless mentioned otherwise.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., $\pm 1\%$, $\pm 2\%$, $\pm 3\%$, $\pm 4\%$, $\pm 5\%$ of the value). These values are merely examples and are not intended to be limiting. The terms "about" and "substantially" can refer to a percentage of the values as interpreted by those skilled in relevant art(s) in light of the teachings herein.

The GAA transistor structures may be patterned by any suitable method. For example, the structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example structures of oxygen-rich gate spacers in FETs (e.g., finFETs and GAA FETs) to reduce parasitic capacitance in the FETs and provides methods of forming the oxygen-rich gate spacers. In some embodiments, a FET can include gate structures surrounding nanostructured channel regions and oxygen-rich gate spacers disposed on sidewalls of the gate structures. The oxygen-rich gate spacers can include oxygen-rich outer gate spacers and oxygen-rich inner gate spacers. The oxygen-rich inner gate spacers can be disposed between the gate structures and source/drain (S/D) regions. The oxygen-rich outer gate spacers can be disposed between the gate structures and S/D contact structures. In some embodiments, the oxygen-rich outer and inner gate spacers can include an oxygen-rich dielectric material with a low dielectric constant (e.g., a dielectric constant between about 1 and about 5) to reduce or minimize parasitic capacitance between the gate structures and the S/D regions and between the gate structures and the S/D contact structures. In some embodiments, the oxygen-rich outer and inner gate spacers can reduce the parasitic capacitance by about 20% to about 50% compared to FETs without the oxygen-rich outer and inner gate spacers. Reducing the parasitic capacitance can improve the reliability and performance of the FET compared to FETs without the oxygen-rich outer and inner gate spacers.

As used herein, the term "oxygen-rich dielectric material" refers to a dielectric material with a non-stoichiometric composition, which has a concentration ratio of oxygen to any other chemical element of the dielectric material higher than that of the dielectric material with a stoichiometric composition. In some embodiments, the oxygen-rich dielectric material can include (i) oxygen-rich silicon oxynitride ($SiO_xN_y$) with a concentration of oxygen atoms higher than the concentrations of silicon atoms and nitrogen atoms, (ii) oxygen-rich silicon oxycarbide ($SiO_xC_y$) with a concentration of oxygen atoms higher than the concentrations of silicon atoms and carbon atoms, (iii) oxygen-rich silicon oxycarbon nitride ($SiO_xC_yN_z$) with a concentration of oxygen atoms higher than the concentrations of silicon atoms, carbon atoms, and nitrogen atoms, (iv) oxygen-rich silicon boron oxynitride ($SiB_xO_yN_z$) with a concentration of oxygen atoms higher than the concentrations of silicon atoms, boron atoms, and nitrogen atoms, (v) oxygen-rich silicon boron oxycarbide ($SiB_xO_yC_z$) with a concentration of oxygen atoms higher than the concentrations of silicon atoms, boron atoms, and carbon atoms, or (vi) other suitable oxygen-rich nitride- or carbide-based dielectric materials. In some embodiments, the oxygen-rich dielectric material can include an oxygen concentration of about 50 atomic % to about 60 atomic %, a silicon concentration of about 10 atomic % to about 20 atomic %, and a nitrogen concentration of about 10 atomic % to about 20 atomic %. In some embodiments, the oxygen-rich dielectric material can include a silicon-to-nitrogen-to-oxygen concentration ratio of about 1:1:2 to about 1:1:3.

In some embodiments, the formation of the oxygen-rich gate spacers can include forming gate spacers with a nitride- or carbide-based dielectric material and then converting the nitride- or carbide-based dielectric material into an oxygen-rich nitride- or carbide-based dielectric material in an oxidation process. In some embodiments, prior to performing the oxidation process, epitaxial barrier layers (also referred to as "epitaxial oxygen barrier layers") can be formed on the nanostructured channel regions to protect them from being oxidized during the oxidation process. In some embodiments, the epitaxial barrier layers can include germanium, which can be oxidized to germanium oxide ($GeO_x$) during the oxidation process. In some embodiments, the epitaxial barrier layers can be removed by reacting with deionized (DI) water after the termination of the oxidation process. Without the use of the epitaxial barrier layers, a thick oxide layer can be formed on the nanostructured channel regions and etching the thick oxide layer can etch the oxygen-rich gate spacers. In addition, the etching can damage the surface profiles of the nanostructured channel regions. Thus, with the use of the epitaxial barrier layers, the gate spacers can be selectively oxidized to form the oxygen-rich gate spacers without compromising the structural integrity of the oxygen-rich gate spacers and the nanostructured channel regions.

Figure 1D:
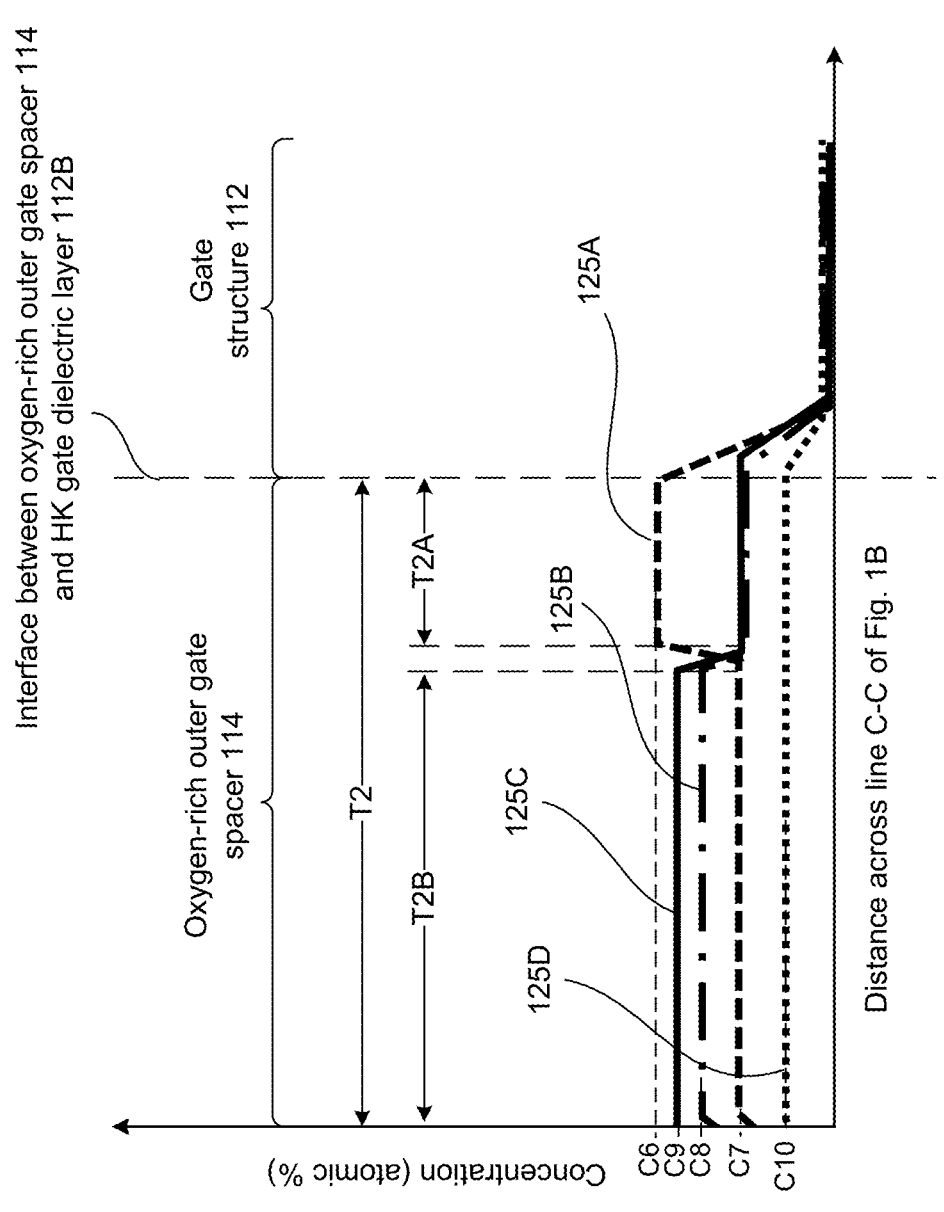

FIG. 1A illustrates an isometric view of a FET 100, according to some embodiments. In some embodiments, FET 100 can be a GAA FET 100 and can have a cross-sectional view along line A-A of FIG. 1A as shown in FIG. 1B. In some embodiments, FET 100 can be a finFET 100 and can have a cross-sectional view along line A-A of FIG. 1A as shown in FIG. 1E. FIGS. 1B and 1E illustrate the different cross-sectional views of FET 100 with additional structures that are not shown in FIG. 1A for simplicity. FIGS. 1C and 1D illustrate concentration profiles of FET 100 along lines B-B and C-C of FIG. 1B. The discussion of elements with the same annotations applies to each other, unless mentioned otherwise.

Referring to FIGS. 1A and 1B, in some embodiments, FET 100 can include (i) a substrate 102, (ii) shallow trench isolation (STI) regions 104 disposed on substrate 102, (iii) fin bases 106 disposed on substrate 102, (iv) S/D regions 108 disposed on fin bases 106, (v) nanostructured channel regions 110 disposed on fin bases 106, (vi) gate structures 112 disposed on nanostructured channel regions 110, (vii) oxygen-rich outer gate spacers 114, (viii) oxygen-rich inner gate spacers 116, (ix) etch stop layers (ESLs) 118 disposed on S/D regions 108, (x) interlayer dielectric (ILD) layers 120 disposed on ESLs 118, and (xi) contact structures 122 disposed on S/D regions 108. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm. In some embodiments, nanostructured channel regions 110 can be in the form of nanosheets, nanowires, nanorods, nanotubes, or other suitable nanostructured shapes.

In some embodiments, substrate 102 can be a semiconductor material, such as silicon, germanium (Ge), silicon germanium (SiGe), a silicon-on-insulator (SOI) structure, and a combination thereof. Further, substrate 102 can be doped with p-type dopants (e.g., boron, indium, aluminum, or gallium) or n-type dopants (e.g., phosphorus or arsenic). In some embodiments, STI regions 104 can include an insulating material, such as silicon oxide ($SiO_2$), silicon nitride (SiN), silicon oxynitride (SiON), silicon carbon nitride (SiCN), silicon oxycarbon nitride (SiOCN), and silicon germanium oxide ($SiGeO_x$). In some embodiments, fin bases 106 can include a material similar to substrate 102. Fin bases 106 can have elongated sides extending along an X-axis.

In some embodiments, S/D regions 108 can include an epitaxially-grown semiconductor material, such as Si, and n-type dopants, such as phosphorus and other suitable n-type dopants. In some embodiments, S/D regions 108 can include an epitaxially-grown semiconductor material, such as Si and SiGe, and p-type dopants, such as boron and other suitable p-type dopants.

In some embodiments, nanostructured channel regions 110 can include semiconductor materials similar to or different from substrate 102. In some embodiments, nanostructured channel regions 110 can include Si, SiAs, silicon phosphide (SiP), SiC, SiCP, SiGe, silicon germanium boron (SiGeB), germanium boron (GeB), silicon-germanium-tin-boron (SiGeSnB), a III-V semiconductor compound, or other suitable semiconductor materials. Though rectangular cross-sections of nanostructured channel regions 110 are shown, nanostructured channel regions 110 can have cross-sections of other geometric shapes (e.g., circular, elliptical, triangular, or polygonal). In some embodiments, nanostructured channel regions 110 can be separated from each other along a Z-axis by a distance of about 8 nm to about 12 nm. In some embodiments, each nanostructured channel region 110 can have a thickness of about 5 nm to about 8 nm along a Z-axis. In some embodiments, each nanostructured channel region 110 can have a width of about 15 nm to about 50 nm along an X-axis.

Each gate structure 112 can be a multi-layered structure and can surround nanostructured channel regions 110 for which gate structures 112 can be referred to as "GAA structures." In some embodiments, each gate structure 112 can include (i) an interfacial oxide (IL) layer 112A, (ii) a high-k (HK) gate dielectric layer 112B disposed on IL layer 112A, (iii) a work function metal (WFM) layer 112C disposed on HK gate dielectric layer 112B, (iv) a gate metal fill layer 112D disposed on WFM layer 112C, and (v) a conductive capping layer 112E disposed on gate metal fill layer 112D. In some embodiments, IL layer 112A can include $SiO_2$, $SiGeO_x$, or $GeO_x$. In some embodiments, HK gate dielectric layer 112B can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). In some embodiments, WFM layer 112C can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, or other suitable Al-based materials for n-type FET 100. In some embodiments, WFM layer 112D can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, and tantalum copper (Ta-Cu) for p-type FET 100. In some embodiments, gate metal fill layer 112D can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

Conductive capping layer 112E can provide a conductive interface between gate metal fill layer 112D and a gate contact structure (not shown) to electrically connect gate metal fill layer 112D to the gate contact structure without forming the gate contact structure directly on or within gate metal fill layer 112D. The gate contact structure is not formed directly on or within gate metal fill layer 112D to prevent contamination by any of the processing materials used in the formation of the gate contact structure. Contamination of gate metal fill layer 112D can lead to the degradation of device performance. Thus, with the use of conductive capping layer 112E, gate structure 112 can be electrically connected to the gate contact structure without compromising the integrity of gate structure 112.

In some embodiments, conductive capping layer 112E can have a thickness of about 1 nm to about 8 nm for adequately providing a conductive interface between gate metal fill layer 112D and the gate contact structure without compromising the size and manufacturing cost of FET 100. In some embodiments, the total thickness of conductive capping layer 112E and gate metal fill layer 112D can range from about 10 nm to about 30 nm. In some embodiments, conductive capping layer 112E can include a metallic material, such as W, Ru, Mo, Co, other suitable metallic materials, and a combination thereof. In some embodiments, conductive capping layer 112E can be formed using a precursor gas of tungsten pentachloride ($WCl_5$) or tungsten hexachloride ($WCl_6$), and as a result, conductive capping layer 112E can include tungsten with impurities of chlorine atoms. The concentration of chlorine atom impurities can range from about 1 atomic percent to about 10 atomic percent of the total concentration of atoms in each conductive capping layer 112E.

In some embodiments, ESLs 118 can be disposed on portions of S/D regions 108 that are not covered by contact structures 122, and ILD layers 120 can be disposed on ESLs 118. In some embodiments, ESLs 118 and ILD layers 120 can include an insulating material, such as $SiO_2$, SIN, SION, SiCN, SiOCN, and $SiGeO_x$. ESLs 118 and ILD layers 120 are not visible in the cross-sectional view of FIG. 1B.

In some embodiments, each contact structure 122 can include (i) a silicide layer 122A disposed on S/D region 108, (ii) a contact plug 122B disposed on silicide layer 122A, and (iii) a contact liner 122C surrounding contact plug 122B. In some embodiments, each silicide layer 122A can include titanium silicide ($Ti_xSi_y$), tantalum silicide ($Ta_xSi_y$), molybdenum ($Mo_xSi_y$), zirconium silicide ($Zr_xSi_y$), hafnium silicide ($Hf_xSi_y$), scandium silicide ($Sc_xSi_y$), yttrium silicide ($Y_xSi_y$), terbium silicide ($Tb_xSi_y$), lutetium silicide ($Lu_xSi_y$), erbium silicide ($Er_xSi_y$), ybtterbium silicide ($Yb_xSi_y$), europium silicide ($Eu_xSi_y$), thorium silicide ($Th_xSi_y$), other suitable metal silicide materials, or a combination thereof for n-type FET 100. In some embodiments, each silicide layer 122A can include nickel silicide ($Ni_xSi_y$), cobalt silicide ($Co_xSi_y$), manganese silicide ($Mn_xSi_y$), tungsten silicide ($W_xSi_y$), iron silicide ($Fe_xSi_y$), rhodium silicide ($Rh_xSi_y$), palladium silicide ($Pd_xSi_y$), ruthenium silicide ($Ru_xSi_y$), platinum silicide ($Pt_xSi_y$), iridium silicide ($Ir_xSi_y$), osmium silicide ($Os_xSi_y$), other suitable metal silicide materials, or a combination thereof for p-type FET 100.

In some embodiments, each contact plug 122B can include conductive materials with low resistivity (e.g., resistivity of about 50 μΩ-cm, about 40 μΩ-cm, about 30 μΩ-cm, about 20 μΩ-cm, or about 10 μΩ-cm), such as Co, W, Ru, Al, Mo, iridium (Ir), nickel (Ni), Osmium (Os), rhodium (Rh), other suitable conductive materials with low resistivity, and a combination thereof. Each contact liner 122C can prevent the oxidation of contact plug 122B by preventing the diffusion of oxygen atoms from adjacent structures (e.g., ILD layers 120) to contact plug 122B. In some embodiments, contact liner 122C can include a dielectric nitride or carbide material, such as SiN, SiCN, silicon carbide (SiC), and other suitable dielectric nitride or carbide materials. In some embodiments, contact liner 122C can have a thickness of about 1.5 nm to about 4 nm. Within this range of thickness, contact liner 122C can adequately prevent the oxidation of contact plug 122B without compromising the size and manufacturing cost of FET 100. In some embodiments, top surfaces of contact plugs 122B, contact liners 122C, and conductive capping layers 112E can be substantially coplanar with each other.

In some embodiments, gate structures 112 can be electrically isolated from adjacent contact structures 122 by oxygen-rich outer gate spacers 114. In some embodiments, gate regions 112R of gate structures 112 surrounding nanostructured channel regions 110 can be electrically isolated from adjacent S/D regions 108 by oxygen-rich inner gate spacers 116. In some embodiments, the interface between oxygen-rich inner gate spacers 116 and gate regions 112R can have a linear profile, as shown in FIG. 1B, or can have a curved profile (not shown).

In some embodiments, oxygen-rich outer and inner gate spacers 114 and 116 can include an oxygen-rich dielectric material with a low dielectric constant (e.g., a dielectric constant between about 1 and about 5) to reduce or minimize parasitic capacitance between gate structures 112 and S/D regions 108 and between gate regions 112R and contact structures 122. Reducing the parasitic capacitance can improve the reliability and performance of FET 100 compared to FETs without oxygen-rich outer and inner gate spacers 114 and 116.

In some embodiments, oxygen-rich outer and inner gate spacers 114 and 116 can include an oxygen-rich dielectric material similar to or different from each other. In some embodiments, the oxygen-rich dielectric material can include (i) oxygen-rich silicon oxynitride ($SiO_xN_y$) with a concentration of oxygen atoms higher than the concentrations of silicon atoms and nitrogen atoms, (ii) oxygen-rich silicon oxycarbide ($SiO_xC_y$) with a concentration of oxygen atoms higher than the concentrations of silicon atoms and carbon atoms, (iii) oxygen-rich silicon oxycarbon nitride ($SiO_xC_yN_z$) with a concentration of oxygen atoms higher than the concentrations of silicon atoms, carbon atoms, and nitrogen atoms, (iv) oxygen-rich silicon boron oxynitride ($SiB_xO_yN_z$) with a concentration of oxygen atoms higher than the concentrations of silicon atoms, boron atoms, and nitrogen atoms, (v) oxygen-rich silicon boron oxycarbide ($SiB_xO_yC_z$) with a concentration of oxygen atoms higher than the concentrations of silicon atoms, boron atoms, and carbon atoms, or (vi) other suitable oxygen-rich nitride- or carbide-based dielectric materials.

In some embodiments, the oxygen-rich dielectric material can include an oxygen concentration of about 50 atomic % to about 60 atomic %, a silicon concentration of about 10 atomic % to about 20 atomic %, and a nitrogen concentration of about 10 atomic % to about 20 atomic %. In some embodiments, the oxygen-rich dielectric material can include a silicon-to-nitrogen-to-oxygen concentration ratio of about 1:1:2 to about 1:1:3. Within these concentration ranges and ratios, oxygen-rich outer and inner gate spacers 114 and 116 can be formed with an adequately low dielectric constant (e.g., a dielectric constant between about 1 and about 5) for reducing or minimizing parasitic capacitance between gate structures 112 and contact structures 122 and between gate regions 112R and S/D regions 108.

In some embodiments, each oxygen-rich inner gate spacer 116 can have a thickness T1 of about 1 nm to about 10 nm to provide adequate electrical isolation between gate regions 112R and S/D regions 108. In some embodiments, each oxygen-rich inner gate spacer 116 can have an oxygen concentration profile 124A, a nitrogen concentration profile 124B, a silicon concentration profile 124C, and a concentration profile 124D of other chemical elements (e.g., carbon and/or boron) across line B-B of FIG. 1B, as shown in FIG.

1C. In some embodiments, concentration profile 124A can have a concentration C1, concentration profiles 124B and 124C can have concentrations C2, and concentration profile 124D can have a concentration C5 across a thickness T1A of oxygen-rich inner gate spacer 116 from an interface between HK gate dielectric layer 112B and oxygen-rich inner gate spacer 116. In some embodiments, concentration profiles 124A, 124B, 124C, and 124D can have concentrations C2, C3, C4, and C5, respectively, across a thickness T1B of oxygen-rich inner gate spacer 116 from an interface between S/D region 108 and oxygen-rich inner gate spacer 116.

In some embodiments, (i) concentration C1 is higher than concentrations C2, C3, C4, and C5, (ii) concentration C4 is higher than concentrations C2, C3, and C5, (iii) concentration C3 is higher than concentrations C2 and C5, and (iv) concentration C2 is higher than concentration C5. In some embodiments, concentration C1 can be about 50 atomic % to about 60 atomic %, concentrations C2, C3, and C4 can be about 10 atomic % to about 20 atomic %, and concentration C5 can be about 0 atomic % to about 10 atomic %. In some embodiments, a ratio of concentration C1 to concentration C2 (C1:C2) can be about 2:1 to about 3:1. In some embodiments, (i) a ratio of thickness T1A to thickness T1B (T1A:T1B) can be about 1:1 to about 1:3, (ii) a ratio of thickness T1B to thickness T1A (T1B:T1A) can be about 1:1 to about 1:3, (iii) a ratio of thickness T1A to thickness T1 (T1A:T1) can be about 1:2 to about 1:4, and (iv) a ratio of thickness T1B to thickness T1 (T1B:T1) can be about 1:2 to about 1:4. With such concentration profiles 124A, 124B, 124C, and 124D, oxygen-rich inner gate spacers 116 can be formed with an adequately low dielectric constant (e.g., a dielectric constant between about 1 and about 5) for reducing or minimizing parasitic capacitance between gate regions 112R and S/D regions 108.

In some embodiments, each oxygen-rich outer gate spacer 114 can have a thickness T2 of about 1 nm to about 10 nm to provide adequate electrical isolation between gate structures 112 and contact structures 122. Similar to oxygen-rich inner gate spacers 116, in some embodiments, each oxygen-rich outer gate spacer 114 can have an oxygen concentration profile 125A, a nitrogen concentration profile 125B, a silicon concentration profile 125C, and a concentration profile 125D of other chemical elements (e.g., carbon and/or boron) across line C-C of FIG. 1B, as shown in FIG. 1D. In some embodiments, concentration profile 125A can have a concentration C6, concentration profiles 125B and 125C can have concentrations C7, and concentration profile 125D can have a concentration C10 across a thickness T2A of oxygen-rich outer gate spacer 114 from an interface between HK gate dielectric layer 112B and oxygen-rich outer gate spacer 114. In some embodiments, concentration profiles 125A, 125B, 125C, and 125D can have concentrations C7, C8, C9, and C10, respectively, across a thickness T2B of oxygen-rich outer gate spacer 114 from an interface between contact structure 122 and oxygen-rich outer gate spacer 114.

In some embodiments, (i) concentration C6 is higher than concentrations C7, C8, C9, and C10, (ii) concentration C9 is higher than concentrations C7, C8, and C10, (iii) concentration C8 is higher than concentrations C7 and C10, and (iv) concentration C7 is higher than concentration C10. In some embodiments, concentration C6 can be about 50 atomic % to about 60 atomic %, concentrations C7, C8, and C9 can be about 10 atomic % to about 20 atomic %, and concentration C10 can be about 0 atomic % to about 10 atomic %. In some embodiments, a ratio of concentration C6 to concentration C7 (C6:C7) can be about 2:1 to about 3:1. In some embodiments, (i) a ratio of thickness T2A to thickness T2B (T2A:T2B) can be about 1:1 to about 1:3, (ii) a ratio of thickness T2B to thickness T2A (T2B:T2A) can be about 1:1 to about 1:3, (iii) a ratio of thickness T2A to thickness T2 (T2A:T2) can be about 1:2 to about 1:4, and (iv) a ratio of thickness T2B to thickness T2 (T2B:T2) can be about 1:2 to about 1:4. With such concentration profiles 125A, 125B, 125C, and 125D, oxygen-rich outer gate spacers 114 can be formed with an adequately low dielectric constant (e.g., a dielectric constant between about 1 and about 5) for reducing or minimizing parasitic capacitance between gate structures 112 and contact structures 122.

In some embodiments, FET 100 can be a finFET 100, instead of a GAA FET 100 and can have a cross-sectional view, as shown in FIG. 1E, along line A-A of FIG. 1A, according to some embodiments. The discussion of elements in FIGS. 1A, 1B, 1D, and 1E with the same annotations applies to each other, unless mentioned otherwise. In some embodiments, finFET 100 can have fin structures 106 disposed on substrate 102 instead of nanostructured channel regions 110 and fin bases 106 disposed on substrate 102. Unlike GAA FET 100, finFET 100 can have gate structures 112 disposed on fin structures 106, which can function as channel regions. Similar to GAA FET 100, finFET 100 can have oxygen-rich gate outer spacers 114 with an adequately low dielectric constant (e.g., a dielectric constant between about 1 and about 5) for reducing or minimizing parasitic capacitance between gate structures 112 and contact structures 122.

FIG. 2 is a flow diagram of an example method 200 for fabricating FET 100 with the cross-sectional view of FIG. 1B and concentration profiles of FIGS. 1C and 1D, according to some embodiments. For illustrative purposes, the operations illustrated in FIG. 2 will be described with reference to the example fabrication process for fabricating FET 100 as illustrated in FIGS. 3A, 4, 5A, and 6-14 and with reference to FIGS. 3B and 5B, which illustrate concentration profiles of FET 100 during a stage of its fabrication process. FIGS. 3A, 4, 5A, and 6-14 are cross-sectional views of FET 100 along line A-A of FIG. 1A at various stages of its fabrication process, according to some embodiments. Operations can be performed in a different order or not performed depending on specific applications. It should be noted that method 200 may not produce a complete FET 100. Accordingly, it is understood that additional processes can be provided before, during, and after method 200, and that some other processes may only be briefly described herein. Elements in FIGS. 3A-3B, 4, 5A-5B, and 6-14 with the same annotations as elements in FIGS. 1A-1D are described above.

Referring to FIG. 2, in operation 205, a superlattice structure with nanostructured channel regions and nanostructured sacrificial layers are formed on a fin base on a substrate. For example, as described with reference to FIG. 3A, a superlattice structure 311 is formed on fin base 106 on substrate 102. In some embodiments, superlattice structure 311 can include epitaxially-grown nanostructured channel regions 110 and nanostructured sacrificial layers 310 arranged in an alternating configuration. In some embodiments, nanostructured channel regions 110 can include Si without any substantial amount of Ge (e.g., with no Ge) and nanostructured sacrificial layers 310 can include SiGe. During subsequent processing, nanostructured sacrificial layers 310 can be replaced in a gate replacement process to form gate regions 112R.

Referring to FIG. 2, in operation 210, polysilicon structures are formed on the superlattice structure and outer gate spacers are formed on the polysilicon structures. For example, as described with reference to FIG. 3A, polysilicon structures 312 are formed on superlattice structure 311 and outer gate spacers 314 are formed on sidewalls of polysilicon structures 314. The formation of polysilicon structures 312 can include sequential operations of (i) depositing a polysilicon layer (not shown) on superlattice structure 311 and (ii) performing a patterning process (e.g., lithography process) on the polysilicon layer to form polysilicon structures 312, as shown in FIG. 3A. During subsequent processing, polysilicon structures 312 can be replaced in a gate replacement process to form gate structures 112.

The formation of polysilicon structures 312 can be followed by the formation of outer gate spacers 314, which can include sequential operations of (i) depositing a first nitride- or carbide-based dielectric layer (not shown) on polysilicon structures 312 and on portions of superlattice structure 311 uncovered by polysilicon structures 312, and (ii) performing a patterning process (e.g., lithography process) on the first nitride- or carbide-based dielectric layer to form outer gate spacers 314, as shown in FIG. 3A. In some embodiments, the first nitride- or carbide-based dielectric layer can include a stoichiometric composition of (i) silicon oxynitride (SiON), (ii) silicon oxycarbide (SiOC), (iii) silicon oxycarbon nitride (SiOCN), (iv) silicon boron oxynitride (SiBON), (v) silicon boron oxycarbide (SiBOC), or (vi) other suitable nitride- or carbide-based dielectric materials. In some embodiments, the first nitride- or carbide-based dielectric layer can include an oxygen concentration of about 10 atomic % to about 20 atomic %, a silicon concentration of about 30 atomic % to about 40 atomic %, and a nitrogen concentration of about 20 atomic % to about 30 atomic %. In some embodiments, the first nitride- or carbide-based dielectric layer can include a silicon-to-nitrogen-to-oxygen concentration ratio of about 3:2:1 to about 4:3:2.

Figure 3B:
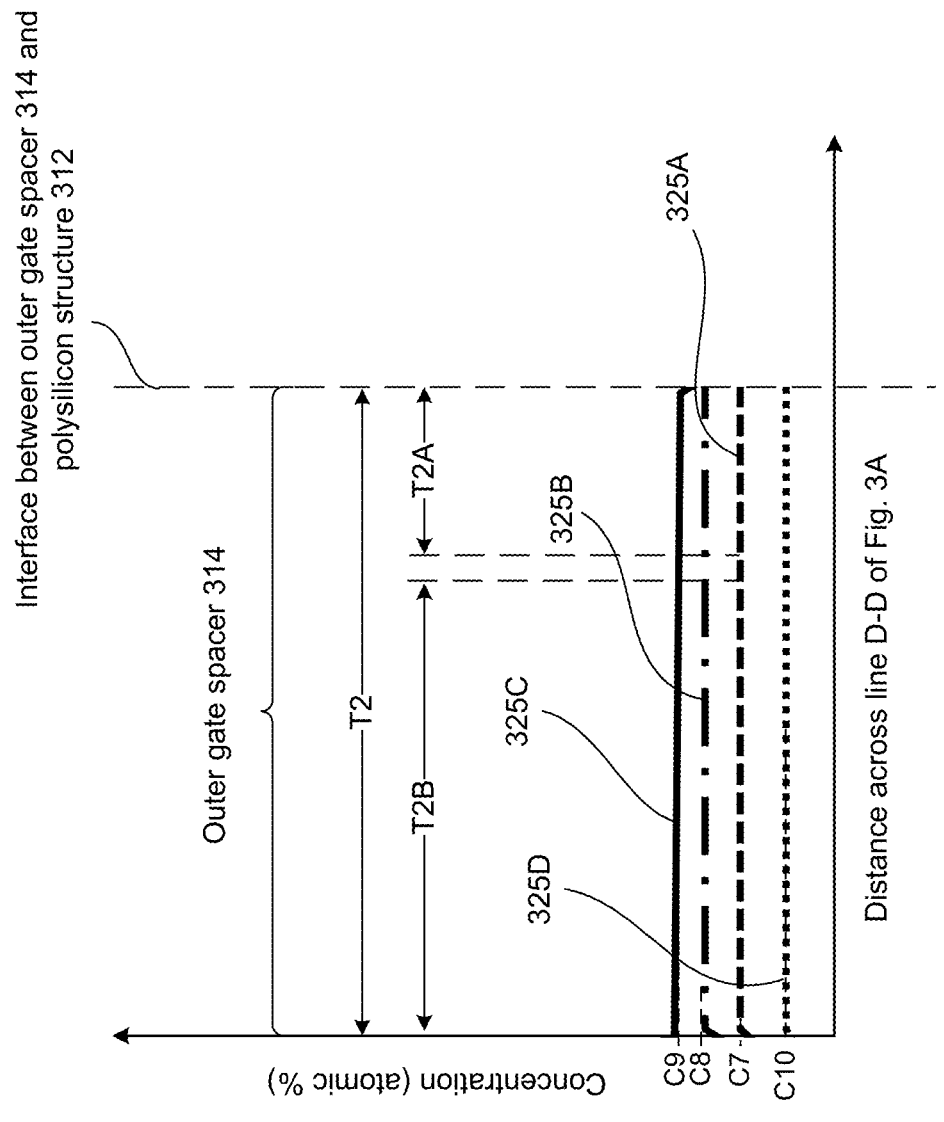
FIGS. 3B and 5B illustrate characteristics of gate spacers in a semiconductor device at a stage of its fabrication process, in accordance with some embodiments.

In some embodiments, each outer gate spacer 314 can have an oxygen concentration profile 325A, a nitrogen concentration profile 325B, a silicon concentration profile 325C, and a concentration profile 325D of other chemical elements (e.g., carbon and/or boron) across line D-D of FIG. 3A, as shown in FIG. 3B. In some embodiments, concentration profiles 325A, 325B, 325C, and 325D can have concentrations C7, C8, C9, and C10, respectively, across thickness T2. In some embodiments, (i) concentration C9 is higher than concentrations C7, C8, and C10, (ii) concentration C8 is higher than concentrations C7 and C10, and (iii) concentration C7 is higher than concentration C10. In some embodiments, concentration C7 can be about 10 atomic % to about 20 atomic %, concentration C8 can be about 20 atomic % to about 30 atomic %, concentration C9 can be about 30 atomic % to about 40 atomic %, and concentration C10 can be about 0 atomic % to about 10 atomic %. In some embodiments, a ratio of concentration C7 to concentration C8 (C7:C8) can be about 1:2 to about 2:3. During subsequent processing, outer gate spacers 314 can be converted to oxygen-rich outer gate spacers 114.

Referring to FIG. 2, in operation 215, S/D openings and spacer openings are formed in the superlattice structure. For example, as described with reference to FIG. 4, S/D region openings 408 and spacer openings 416 are formed on different portions of superlattice structure 310. The formation of S/D openings 408 can include etching portions of superlattice structure 310 and fin base 106 that are non-overlapping with polysilicon structures 312. The formation of spacer openings 416 can include laterally etching portions of nanostructured sacrificial layers overlapping with outer gate spacers 314.

Referring to FIG. 2, in operation 220, inner gate spacers are formed in the spacer openings. For example, as described with reference to FIG. 5A, inner gate spacers 516 are formed in spacer openings 416. The formation of inner gate spacers 516 can include sequential operations of (i) depositing a second nitride- or carbide-based dielectric layer (not shown) on the structure of FIG. 4, and (ii) performing a dry etch process on the second nitride- or carbide-based dielectric layer to form inner gate spacers 516, as shown in FIG. 5A. In some embodiments, the second nitride- or carbide-based dielectric layer can include a stoichiometric composition of (i) SiON, (ii) SiOC, (iii) SiOCN, (iv) SiBON, (v) SiBOC, or (vi) other suitable nitride- or carbide-based dielectric materials. In some embodiments, the second nitride- or carbide-based dielectric layer can include an oxygen concentration of about 10 atomic % to about 20 atomic %, a silicon concentration of about 30 atomic % to about 40 atomic %, and a nitrogen concentration of about 20 atomic % to about 30 atomic %. In some embodiments, the second nitride- or carbide-based dielectric layer can include a silicon-to-nitrogen-to-oxygen concentration ratio of about 3:2:1 to about 4:3:2. In some embodiments, the first and second nitride- or carbide-based dielectric layers can be similar to or different from each other.

Figure 5B:
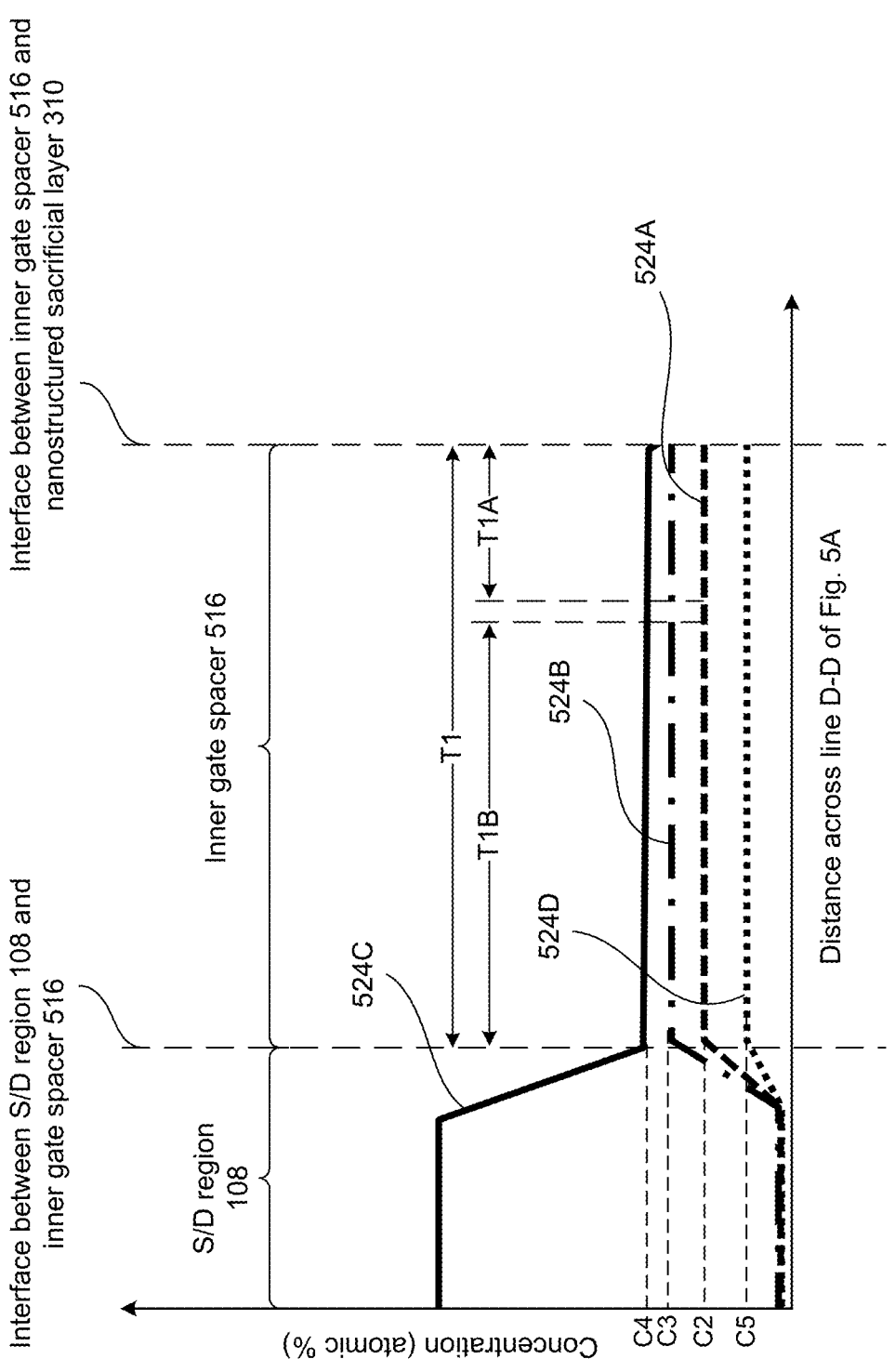

In some embodiments, each inner gate spacer 516 can have an oxygen concentration profile 524A, a nitrogen concentration profile 524B, a silicon concentration profile 524C, and a concentration profile 524D of other chemical elements (e.g., carbon and/or boron) across line E-E of FIG. 5A, as shown in FIG. 5B. In some embodiments, concentration profiles 524A, 524B, 524C, and 524D can have concentrations C2, C3, C4, and C5, respectively, across thickness T1. In some embodiments, (i) concentration C4 is higher than concentrations C2, C3, and C5, (ii) concentration C3 is higher than concentrations C2 and C5, and (iii) concentration C2 is higher than concentration C5. In some embodiments, concentration C2 can be about 10 atomic % to about 20 atomic %, concentration C3 can be about 20 atomic % to about 30 atomic %, concentration C4 can be about 30 atomic % to about 40 atomic %, and concentration C5 can be about 0 atomic % to about 10 atomic %. In some embodiments, a ratio of concentration C2 to concentration C3 (C2:C3) can be about 1:2 to about 2:3. During subsequent processing, inner gate spacers 516 can be converted to oxygen-rich outer gate spacers 116.

Referring to FIG. 2, in operation 225, S/D regions are formed in the S/D openings. For example, as described with reference to FIG. 5A, S/D regions 108 are formed in S/D openings 408 after the formation of inner gate spacers 516. The formation of S/D regions 108 can include epitaxially growing semiconductor material on exposed portions of fin bases 106 in S/D openings 408. In some embodiments, the formation of S/D regions 108 can be followed by the formation of ESLs 118 and ILD layers 120, as shown in FIG. 6.

Referring to FIG. 2, in operation 230, gate openings are formed. For example, as described with reference to FIG. 7, gate openings 712 are formed around nanostructured channel regions 110. The formation of gate openings 712 can include removing polysilicon structures 312 and nanostructured sacrificial layers 310 in an etching process.

Referring to FIG. 2, in operation 235, the outer gate spacers are converted to oxygen-rich outer gate spacers and the inner gate spacers are converted to oxygen-rich inner gate spacers. For example, as described with reference to FIGS. 8-10, outer gate spacers 314 are converted to oxygen-rich outer gate spacers 114 and inner gate spacers 516 are converted to oxygen-rich inner gate spacers 116. This conversion of outer gate spacers 314 and inner gate spacers 516 can include sequential operations of (i) forming epitaxial barrier layers 826 directly on and surrounding nanostructured channel regions 110 in gate openings 712, as shown in FIG. 8, (ii) performing an oxidation process on the structure of FIG. 9 to form oxygen-rich outer and gate spacers 114 and 116 and oxidized epitaxial barrier layers 926, as shown in FIG. 9, and (iii) removing oxidized epitaxial barrier layers 926 to form the structure of FIG. 10.

The formation of epitaxial barrier layers 826 is selective to the exposed portions of nanostructured channel regions 110 in gate openings 712. That is, epitaxial barrier layers 826 does not grow on other exposed regions, such as outer gate spacers 314, ESLs 118, and ILD layers 120 of the structure of FIG. 8, except for nanostructured channel regions 110. In some embodiments, forming epitaxial barrier layers 826 can include epitaxially growing germanium (Ge) layers with a thickness of about 1 nm to about 3 nm using a precursor gas of germane ($GeH_4$) in a low temperature of about 300° C. to about 400° C. In some embodiments, about 1 nm to about 3 nm thick epitaxial barrier layers 826 can be used to adequately prevent nanostructured channel regions 110 from being oxidized without compromising the oxidation of outer and inner gate spacers 314 and 516 during the oxidation process. In some embodiments, the thickness of epitaxial barrier layers 826 can be tuned to control the oxidation rate of top surfaces of nanostructured channel regions 110 without compromising the oxidation of outer and inner gate spacers 314 and 516 during the oxidation process. The oxidation rate can be controlled to oxidize the top surfaces of nanostructured channel regions 110 and form oxide layers 912 (shown in dashed lines in FIGS. 9 and 10) with a thickness less than about 1 nm (e.g., about 0.1 nm to about 0.9 nm) at the interfaces between nanostructured channel regions 110 and oxidized epitaxial barrier layers 926. Oxide layers 912 can be treated in a wet clean process and a densification process to form IL layers 112A of gate structures 112, as shown in FIG. 11. These wet clean and densification processes can be performed on oxide layers without compromising the structure of oxygen-rich outer and inner gate spacers 114 and 116.

In some embodiments, if oxide layers 912 are formed in the structure of FIG. 9, the wet clean process can be performed on oxide layers 912 after removing oxidized epitaxial barrier layers 926, as shown in FIG. 10. In some embodiments, the wet clean process can include (i) using a mixture (referred to as "Piranha solution") of sulfuric acid ($H_2SO_4$) and hydrogen peroxide ($H_2O_2$) at a temperature of about 60° C. to about 100° C., (ii) using an ozone ($O_3$) solution of $O_3$ in DI water, (iii) using a mixture of ammonium hydroxide ($NH_4OH$) and $H_2O_2$, and/or (iv) using a mixture of hydrochloric acid (HCl) and $H_2O_2$. The wet clean process can be followed by the densification process, which can include performing an anneal process at a temperature of about 300° C. to about 550° C.

Thus, with the use of epitaxial barrier layers 826, the oxidation of nanostructured channel regions 110 can be controlled to either prevent the formation of oxide layers 912 on nanostructured channel regions 110 or grow a desired thickness of oxide layers 912 for subsequent formation of IL layers 112A, as discussed above. Without the use of epitaxial barrier layers 826, oxide layers thicker than about 1 nm (e.g., about 1.1 nm to about 3 nm) are formed on nanostructured channel regions 110. These oxide layers are too thick to function as IL layers 112A after being treated in the wet clean and densification processes. To use these thick oxide layers to form IL layers 112A, an etch process is need to be performed prior to the wet clean process to reduce their thicknesses to less than about 1 nm (e.g., about 0.1 nm to about 0.9 nm). However, the etch process can also etch oxygen-rich outer and inner gate spacers 114 and 116 formed in the oxidation process. Thus, without the use of epitaxial barrier layers 826, the oxidation of nanostructured channel regions 110 can neither be prevented nor controlled to grow an oxide layer for subsequent formation of IL layers 112A without compromising the structure of oxygen-rich outer and inner gate spacers 114 and 116.

In some embodiments, the oxidization process can include exposing the structure of FIG. 8 to oxygen radicals in a remote plasma chamber or performing an annealing process on the structure of FIG. 8 in an oxygen ambient for about 10 seconds to about 30 seconds. The oxidation process can oxidize outer and inner gate spacers 314 and 516 to form oxygen-rich outer and inner gate spacers 114 and 116, respectively. The oxidation of outer and inner gate spacers 314 and 516 can convert their stoichiometric composition to the non-stoichiometric composition of oxygen-rich outer and inner gate spacers 114 and 116, and as a result reduce the dielectric constants of outer and inner gate spacers 314 and 516 to that of oxygen-rich outer and inner gate spacers 114 and 116, respectively.

The oxidation process can further oxidize epitaxial barrier layers 826 to form oxidized epitaxial barrier layers 926, as shown in FIG. 9. In some embodiments, oxidized epitaxial barrier layers 926 can include $GeO_x$ when epitaxial barrier layers 826 include Ge. In some embodiments, the removal of oxidized epitaxial barrier layers 926 including $GeO_x$ can include exposing the structure of FIG. 9 to DI water. The DI water can selectively etch $GeO_x$ without etching oxygen-rich outer and inner gate spacers 114 and 116 and nanostructured channel regions 110. In some embodiments, if oxide layers 912 are formed, the DI water can also etch $GeO_x$ without etching oxide layers 912.

Referring to FIG. 2, in operation 240, gate structures are formed in the gate openings. For example, as described with reference to FIGS. 11-13, gate structures 112 are formed in gate openings 712. The formation of gate structures 112 can include sequential operations of (i) forming IL layers 112A on surfaces of nanostructured channel regions 110 in gate openings 712, as shown in FIG. 11, (ii) depositing a dielectric layer (not shown) having the material of HK gate dielectric layer 112B on IL layers 112A, (iii) depositing a conductive layer (not shown) having the material of WFM layers 112C on the dielectric layer, (iv) depositing a conductive fill layer (not shown) having the material of gate metal fill layers 112D on the conductive layer, (v) performing a CMP process on the dielectric layer, the conductive layer, and the conductive fill layer to form HK gate dielectric layers 112B, WFM layers 112C, and gate metal fill layers 112D with their top surfaces substantially coplanarized with top surfaces of ESLs 118 and ILD layers 120, as shown in FIG. 12, (vi) etching HK gate dielectric layers 112B, WFM layers 112C, and gate metal fill layers 112D to form recesses (not shown), (vii) depositing a conductive layer (not shown) having the material of conductive capping layers 112E in the recesses and on ESLs 118 and ILD layers 120, and (viii) performing a CMP process on the conductive layer to form conductive capping layers 112E, as shown in FIG. 13.

In some embodiments, IL layers 112A can be formed by performing the wet clean and densification processes on oxide layers 912, as described above with reference to FIGS. 9 and 10. In some embodiments, if the formation of oxide layers 912 on nanostructured channel regions 110 during the oxidation process are prevented, IL layers 112A can be formed by performing the above described wet clean and densification processes on the structure of FIG. 10. In the absence of oxide layers 912 in FIG. 10, the exposed surfaces of nanostructured channel regions 110 in gate openings 712 can react with the chemicals of the wet clean process to form oxide layers, which are densified in the densification process to form IL layers 112A, as shown in FIG. 11.

Referring to FIG. 2, in operation 245, contact structures are formed on the S/D regions. For example, as described with reference to FIG. 14, contact structures 122 are formed on S/D regions 108. The formation of contact structures 122 can include sequential operations of (i) removing portions of ESLs and ILD layers 120 on S/D regions 108 to form contact openings (not shown) on S/D regions 108, (ii) forming contact liners 122B in the contact openings, (iii) forming silicide layers 122A on the exposed surfaces of S/D regions 108 in the contact openings, and (iv) forming contact plugs 122C in the contact openings.

FIG. 15 is a flow diagram of an example method 1500 for fabricating FET 100 with the cross-sectional view of FIG. 1E, according to some embodiments. For illustrative purposes, the operations illustrated in FIG. 15 will be described with reference to the example fabrication process for fabricating FET 100 as illustrated in FIGS. 16-20. FIGS. 16-20 are cross-sectional views of FET 100 along line A-A of FIG. 1A at various stages of its fabrication process, according to some embodiments. Operations can be performed in a different order or not performed depending on specific applications. It should be noted that method 1500 may not produce a complete FET 100. Accordingly, it is understood that additional processes can be provided before, during, and after method 1500, and that some other processes may only be briefly described herein. Elements in FIGS. 16-20 with the same annotations as elements in FIGS. 1A, 1B, 1D, 1E, 3A, 3B, 4, 5A, and 6-14 are described above.

Referring to FIG. 15, in operation 1505, polysilicon structures are formed on a fin structure and outer gate spacers are formed on the polysilicon structures. For example, as described with reference to FIG. 16, polysilicon structures 312 are formed on fin structure 106 and outer gate spacers 314 are formed on sidewalls of polysilicon structures 314. The formation of polysilicon structures 312 can include sequential operations of (i) depositing a polysilicon layer (not shown) on fin structure 106 and (ii) performing a patterning process (e.g., lithography process) on the polysilicon layer to form polysilicon structures 312, as shown in FIG. 16. During subsequent processing, polysilicon structures 312 can be replaced in a gate replacement process to form gate structures 112. The formation of polysilicon structures 312 can be followed by the formation of outer gate spacers 314. The process for forming outer gate spacers 314 of FIG. 16 is similar to that described above with reference to FIGS. 3A and 3B.

Referring to FIG. 15, in operation 1510, S/D regions are formed on the fin structure. For example, as described with reference to FIG. 16, S/D regions 108 are formed on portions of fin structure 106 that are non-overlapping with polysilicon structures 312. The formation of S/D regions 108 can include forming S/D openings (not shown) in fin structure 106 and epitaxially growing semiconductor material on exposed portions of fin structure 106 in the S/D openings. In some embodiments, the formation of S/D regions 108 can be followed by the formation of ESLs 118 and ILD layers 120, as shown in FIG. 16.

Referring to FIG. 15, in operation 1515, gate openings are formed. For example, as described with reference to FIG.

17, gate openings 712 are formed on fin structure 106. The formation of gate openings 712 can include removing poly-silicon structures 312 in an etching process.

Referring to FIG. 15, in operation 1520, the outer gate spacers are converted to oxygen-rich outer gate spacers. For example, as described with reference to FIGS. 17-19, outer gate spacers 314 are converted to oxygen-rich outer gate spacers 114. This conversion of outer gate spacers 314 can include sequential operations of (i) forming epitaxial barrier layers 1726 on the exposed surfaces of nanostructured channel regions 110 in gate openings 712, as shown in FIG. 17, (ii) performing the oxidation process (described above in operation 235) on the structure of FIG. 17 to form oxygen-rich outer gate spacers 114 and oxidized epitaxial barrier layers 1826, as shown in FIG. 18, and (iii) removing oxidized epitaxial barrier layers 1826 using DI water to form the structure of FIG. 19. The discussion of epitaxial barrier layers 826 and oxidized epitaxial barrier layers 926 applies to epitaxial barrier layers 1726 and oxidized epitaxial barrier layers 1826, unless mentioned otherwise.

Similar to epitaxial barrier layers 826, epitaxial barrier layers 1726 can be used to control the oxidation of the exposed surfaces of fin structure 106 to either grow a desired thickness of oxide layers 1812 (shown in dashed lines in FIGS. 18 and 19) at the interfaces between fin structure 106 and oxidized epitaxial barrier layers 1826 for subsequent formation of IL layers 112A or prevent the formation of oxide layers 1812. Similar to oxide layers 812, oxide layers 1812 can be treated in the wet clean and densification processes (described above in operation 235) to form IL layers 112A. If oxide layers 1812 are formed in the structure of FIG. 18, the wet clean process can be performed on oxide layers 1812 after removing oxidized epitaxial barrier layers 1826, as shown in FIG. 19. The wet clean process can be followed by the densification process to form IL layers 112A.

Referring to FIG. 15, in operation 1525, gate structures are formed in the gate openings. For example, as described with reference to FIG. 20, gate structures 112 are formed in gate openings 712. The process for forming gate structures 112 of FIG. 20 is similar to that described above with reference to FIGS. 11-13. In some embodiments, IL layers 112A of FIG. 20 can be formed by performing the wet clean and densification processes on oxide layers 1812, as described above with reference to FIGS. 18 and 19. In some embodiments, if the formation of oxide layers 1812 on fin structure 106 during the oxidation process are prevented, IL layers 112A can be formed by performing the wet clean and densification processes on the structure of FIG. 19. In the absence of oxide layers 1812 in FIG. 19, the exposed surfaces of fin structure 106 in gate openings 712 can react with the chemicals of the wet clean process to form oxide layers, which are densified in the densification process to form IL layers 112A, as shown in FIG. 20.

Referring to FIG. 15, operation 1530 is similar to operation 245 of FIG. 2. After operation 1530, contact structures 122 are formed on S/D regions 108, as shown in FIG. 20.

The present disclosure provides example structures of oxygen-rich gate spacers (e.g., oxygen-rich outer and inner gate spacers 114 and 116) in FETs (e.g., finFETs and GAA FETs) to reduce parasitic capacitance in the FETs and provides methods of forming the oxygen-rich gate spacers. In some embodiments, a FET (e.g., GAA FET 100) can include gate structures (e.g., gate structures 112) surrounding nanostructured channel regions (e.g., nanostructured channel regions 110) and oxygen-rich gate spacers disposed on sidewalls of the gate structures. The oxygen-rich gate spacers can include oxygen-rich outer gate spacers (e.g., oxygen-rich outer gate spacers 114) and oxygen-rich inner gate spacers (e.g., oxygen-rich inner gate spacers 116). The oxygen-rich inner gate spacers can be disposed between the gate structures and S/D regions (e.g., S/D regions 108). The oxygen-rich outer gate spacers can be disposed between the gate structures and S/D contact structures (e.g., contact structures 122). In some embodiments, the oxygen-rich outer and inner gate spacers can include an oxygen-rich dielectric material with a low dielectric constant (e.g., a dielectric constant between about 1 and about 5) to reduce or minimize parasitic capacitance between the gate structures and the S/D regions and between the gate structures and the S/D contact structures. In some embodiments, the oxygen-rich dielectric material can include an oxygen concentration of about 50 atomic % to about 60 atomic %, a silicon concentration of about 10 atomic % to about 20 atomic %, and a nitrogen concentration of about 10 atomic % to about 20 atomic %. In some embodiments, the oxygen-rich dielectric material can include a silicon-to-nitrogen-to-oxygen concentration ratio of about 1:1:2 to about 1:1:3. In some embodiments, the oxygen-rich outer and inner gate spacers can reduce the parasitic capacitance by about 20% to about 50% compared to FETs without the oxygen-rich outer and inner gate spacers. Reducing the parasitic capacitance can improve the reliability and performance of the FET compared to FETs without the oxygen-rich outer and inner gate spacers.

In some embodiments, the formation of the oxygen-rich gate spacers can include forming gate spacers with a nitride- or carbide-based dielectric material and then converting the nitride- or carbide-based dielectric material into an oxygen-rich nitride- or carbide-based dielectric material in an oxidation process. In some embodiments, prior to performing the oxidation process, epitaxial barrier layers (e.g., epitaxial barrier layers 826 and 1726) can be formed on the nano-structured channel regions to protect them from being oxidized during the oxidation process. In some embodiments, the epitaxial barrier layers can include germanium, which can be oxidized to germanium oxide ($GeO_x$) during the oxidation process. In some embodiments, the epitaxial barrier layers can be removed by reacting with DI water after the termination of the oxidation process. Without the use of the epitaxial barrier layers, a thick oxide layer can be formed on the nanostructured channel regions and etching the thick oxide layer can etch the oxygen-rich gate spacers. In addition, the etching can damage the surface profiles of the nanostructured channel regions. Thus, with the use of the epitaxial barrier layers, the gate spacers can be selectively oxidized to form the oxygen-rich gate spacers without compromising the structural integrity of the oxygen-rich gate spacers and the nanostructured channel regions.

In some embodiments, a method includes forming a fin base on a substrate, forming, on the fin base, a superlattice structure including first and second nanostructured layers, forming a polysilicon structure on the superlattice structure, epitaxially growing a S/D region on the fin base and adjacent to the first nanostructured layer, forming, on a sidewall of the polysilicon structure, an oxygen-rich outer gate spacer including a first dielectric material with a first non-stoichiometric composition, forming, on a sidewall of the second nanostructured layer, an oxygen-rich inner gate spacer including a second dielectric material with a second non-stoichiometric composition, and replacing the polysilicon structure with a gate structure.

In some embodiments, a method includes forming a stack of first and second nanostructured layers on a substrate, forming, on the stack of first and second nanostructured layers, first gate spacers including a first dielectric constant, forming, on a sidewall of the first nanostructured layer, a second gate spacer including a second dielectric constant, removing the first nanostructured layer, forming a semiconductor layer on the second nanostructured layers, oxidizing the first gate spacer to form an oxygen-rich first gate spacer including a third dielectric constant lower than the first dielectric constant, and oxidizing the second gate spacer to form an oxygen-rich second gate spacer including a fourth dielectric constant lower than the second dielectric constant.

In some embodiments, a semiconductor device includes a substrate, a fin base disposed on the substrate, a S/D region disposed on the fin base, a nanostructured channel region disposed on the fin base, a gate structure surrounding the nanostructured channel region, an oxygen-rich outer gate spacer including a first dielectric material with a first non-stoichiometric composition disposed on a sidewall of the gate structure, and an oxygen-rich inner gate spacer including a second dielectric material with a second non-stoichiometric composition and disposed on a sidewall of the second nanostructured layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin base on a substrate;
    forming, on the fin base, a superlattice structure comprising first and second nanostructured layers;
    forming a polysilicon structure on the superlattice structure;
    epitaxially growing a source/drain (S/D) region on the fin base and adjacent to the first nanostructured layer;
    forming, on a sidewall of the polysilicon structure, an oxygen-rich outer gate spacer comprising:
        a first dielectric material with a first non-stoichiometric composition, and
        first and second silicon-to-oxygen concentration ratios across first and second spacer regions, respectively, wherein the first and second silicon-to-oxygen concentration ratios are different from each other;
    forming, on a sidewall of the second nanostructured layer, an oxygen-rich inner gate spacer comprising a second dielectric material with a second non-stoichiometric composition; and
    replacing the polysilicon structure with a gate structure.

2. The method of claim 1, wherein forming the oxygen-rich outer gate spacer comprises:
    depositing, on the sidewall of the polysilicon structure, the first dielectric material with a stoichiometric composition; and
    performing an oxidation process to convert the stoichiometric composition of the first dielectric material into the first non-stoichiometric composition of the first dielectric material.

3. The method of claim 1, wherein forming the oxygen-rich outer gate spacer comprises:
    depositing, on the sidewall of the polysilicon structure, a nitride- or carbide-based dielectric material comprising a first dielectric constant; and
    performing an oxidation process on the nitride- or carbide-based dielectric material to lower the first dielectric constant to a second dielectric constant of the first dielectric material.

4. The method of claim 1, wherein forming the oxygen-rich outer gate spacer comprises:
    forming an outer gate spacer on the sidewall of the polysilicon structure;
    epitaxially growing a germanium layer on the first nanostructured layer;
    performing an oxidation process to form the oxygen-rich outer gate spacer and an oxidized germanium layer; and
    etching the oxidized germanium layer with deionized water to prevent the oxygen-rich outer gate spacer from being etched.

5. The method of claim 1, wherein forming the oxygen-rich outer gate spacer comprises forming the oxygen-rich outer gate spacer with a silicon-to-nitrogen-to-oxygen concentration ratio of about 1:1:2 to about 1:1:3.

6. The method of claim 1, wherein forming the oxygen-rich inner gate spacer comprises:
    depositing, on the sidewall of the second nanostructured layer, the second dielectric material with a stoichiometric composition;
    epitaxially growing a semiconductor layer surrounding the first nanostructured layer; and
    performing an oxidation process to convert the stoichiometric composition of the second dielectric material into the second non-stoichiometric composition of the second dielectric material and to oxidize the semiconductor layer.

7. The method of claim 1, wherein forming the oxygen-rich inner gate spacer comprises:
    depositing, on the sidewall of the second nanostructured layer, a nitride- or carbide-based dielectric material comprising a third dielectric constant; and
    performing an oxidation process on the nitride- or carbide-based dielectric material to lower the third dielectric constant to a fourth dielectric constant of the second dielectric material.

8. The method of claim 1, wherein forming the oxygen-rich inner gate spacer comprises:
    forming an inner gate spacer on the sidewall of the second nanostructured layer;
    removing the polysilicon structure and the second nanostructured layer;
    epitaxially growing an oxygen barrier layer surrounding the first nanostructured layer; and
    oxidizing the inner gate spacer.

9. The method of claim 1, wherein forming the oxygen-rich inner gate spacer comprises forming the oxygen-rich inner gate spacer with a silicon-to-nitrogen-to-oxygen concentration ratio of about 1:1:2 to about 1:1:3.

10. The method of claim 1, wherein forming the oxygen-rich inner gate spacer comprises forming the oxygen-rich inner gate spacer with an oxygen concentration of about 50 atomic % to about 60 atomic %, a silicon concentration of about 10 atomic % to about 20 atomic %, and a nitrogen concentration of about 10 atomic % to about 20 atomic %.

11. A method, comprising:
    forming a stack of first and second nanostructured layers on a substrate;

forming, on the stack of first and second nanostructured layers, a first gate spacer comprising a first dielectric constant;

forming, on a sidewall of the first nanostructured layer, a second gate spacer comprising a second dielectric constant;

removing the first nanostructured layer;

forming a semiconductor layer on the second nanostructured layers;

oxidizing the first gate spacer to form an oxygen-rich first gate spacer comprising a third dielectric constant lower than the first dielectric constant; and oxidizing the second gate spacer to form an oxygen-rich second gate spacer comprising a fourth dielectric constant lower than the second dielectric constant.

12. The method of claim 11, wherein forming the semiconductor layer comprises epitaxially growing a germanium layer.

13. The method of claim 11, further comprising forming an oxide layer between the second nanostructured layer and the semiconductor layer during oxidizing of the first and second gate spacers.

14. The method of claim 11, further comprising oxidizing the semiconductor layer to form an oxidized semiconductor layer during oxidizing of the first and second gate spacers.

15. The method of claim 14, further comprising etching the oxidized semiconductor layer with deionized water to prevent the oxygen-rich first gate spacer from being etched.

16. The method of claim 11, wherein oxidizing the first gate spacer comprises forming the oxygen-rich first gate spacer with an oxygen concentration of about 50 atomic % to about 60 atomic %.

17. A semiconductor device, comprising:

a substrate;

a fin base disposed on the substrate;

a source/drain (S/D) region disposed on the fin base;

a nanostructured channel region disposed on the fin base;

a gate structure surrounding the nanostructured channel region;

an oxygen-rich outer gate spacer comprising:

a first dielectric material with a first non-stoichiometric composition and disposed on a sidewall of the gate structure, a first region with a first silicon-to-nitrogen concentration ratio, and a second region with a second silicon-to-nitrogen concentration ratio different from the first silicon-to-nitrogen concentration ratio; and an oxygen-rich inner gate spacer comprising a second dielectric material with a second non-stoichiometric composition and disposed on an other sidewall of the gate structure.

18. The semiconductor device of claim 17, wherein the oxygen-rich outer gate spacer further comprises:

a first oxygen concentration and a first silicon concentration across the first region of the oxygen-rich outer gate spacer, wherein the first oxygen concentration is higher than the first silicon concentration; and a second oxygen concentration and a second silicon concentration across the second region of the oxygen-rich outer gate spacer, wherein the second oxygen concentration is lower than the second silicon concentration.

19. The semiconductor device of claim 17, wherein the oxygen-rich inner gate spacer comprises:

a first oxygen concentration and a first silicon concentration across a first region of the oxygen-rich inner gate spacer, wherein the first oxygen concentration is higher than the first silicon concentration; and a second oxygen concentration and a second silicon concentration across a second region of the oxygen-rich inner gate spacer, wherein the second oxygen concentration is lower than the second silicon concentration.

20. The semiconductor device of claim 17, wherein the oxygen-rich inner gate spacer comprises:

a first oxygen concentration and a first nitrogen concentration across a first region of the oxygen-rich inner gate spacer, wherein the first oxygen concentration is higher than the first nitrogen concentration; and a second oxygen concentration and a second nitrogen concentration across a second region of the oxygen-rich inner gate spacer, wherein the second oxygen concentration is lower than the second nitrogen concentration.

* * * * *